United States Patent
Hamaguchi et al.

(10) Patent No.: US 10,392,699 B2
(45) Date of Patent: Aug. 27, 2019

(54) METHOD FOR MANUFACTURING STRUCTURE HAVING RECESSED PATTERN, RESIN COMPOSITION, METHOD FOR FORMING ELECTROCONDUCTIVE FILM, ELECTRONIC CIRCUIT, AND ELECTRONIC DEVICE

(71) Applicant: JSR CORPORATION, Minato-ku (JP)

(72) Inventors: Hitoshi Hamaguchi, Minato-ku (JP); Kenrou Tanaka, Minato-ku (JP); Kenzou Ookita, Minato-ku (JP); Keisuke Kuriyama, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 15/509,662

(22) PCT Filed: Sep. 8, 2015

(86) PCT No.: PCT/JP2015/075441
§ 371 (c)(1),
(2) Date: Mar. 8, 2017

(87) PCT Pub. No.: WO2016/039327
PCT Pub. Date: Mar. 17, 2016

(65) Prior Publication Data
US 2017/0306481 A1  Oct. 26, 2017

(30) Foreign Application Priority Data
Sep. 12, 2014 (JP) .................................. 2014-186567

(51) Int. Cl.
*C23C 16/44* (2006.01)
*H05K 3/00* (2006.01)
(Continued)

(52) U.S. Cl.
CPC ............... *C23C 16/44* (2013.01); *B05D 3/06* (2013.01); *B29C 59/16* (2013.01); *C08J 7/00* (2013.01);
(Continued)

(58) Field of Classification Search
CPC .................................. C23C 16/44; B05D 3/06
See application file for complete search history.

(56) References Cited

U.S. PATENT DOCUMENTS

| 2003/0068581 A1 | 4/2003 | Kawamura et al. |
| 2005/0112810 A1 | 5/2005 | Kobayashi et al. |

(Continued)

FOREIGN PATENT DOCUMENTS

| JP | 8-45820 A | 2/1996 |
| JP | H0845820 | * 2/1996 |

(Continued)

OTHER PUBLICATIONS

International Search Report dated Dec. 15, 2015 in PCT/JP2015/075441.
(Continued)

*Primary Examiner* — Robert S Walters, Jr.
*Assistant Examiner* — Kristen A Dagenais-Englehart
(74) *Attorney, Agent, or Firm* — Oblon, McClelland, Maier & Neustadt, L.L.P.

(57) ABSTRACT

The present invention relates to: a method of producing a structure having a recessed pattern; a resin composition; a method of forming an electroconductive film; an electronic circuit; and an electronic device. The method of producing a structure having a recessed pattern includes the following steps (i) and (ii), and the recessed pattern has a film thickness that is thinner by 5% to less than 90% with respect to that of a coating film obtained in the step (i):

(Continued)

(i) the step of forming a coating film on a non-flat surface of a structure using a resin composition which includes an acid-dissociable group-containing polymer and an acid generator; and (ii) the step of forming a recess by subjecting a prescribed part of a portion of the coating film to irradiation with radiation.

11 Claims, 2 Drawing Sheets

(51) Int. Cl.
| | |
|---|---|
| G03F 7/20 | (2006.01) |
| B05D 3/06 | (2006.01) |
| B29C 59/16 | (2006.01) |
| C08J 7/00 | (2006.01) |
| G03F 7/039 | (2006.01) |
| C09D 129/10 | (2006.01) |
| C09D 133/10 | (2006.01) |
| C09D 133/14 | (2006.01) |
| C09D 133/16 | (2006.01) |
| C23C 16/56 | (2006.01) |
| H05K 3/12 | (2006.01) |
| G03F 7/004 | (2006.01) |
| G03F 7/18 | (2006.01) |
| G03F 7/24 | (2006.01) |

(52) U.S. Cl.
CPC ......... *C09D 129/10* (2013.01); *C09D 133/10* (2013.01); *C09D 133/14* (2013.01); *C09D 133/16* (2013.01); *C23C 16/56* (2013.01); *G03F 7/0046* (2013.01); *G03F 7/039* (2013.01); *G03F 7/0392* (2013.01); *G03F 7/18* (2013.01); *G03F 7/20* (2013.01); *G03F 7/24* (2013.01); *H05K 3/0023* (2013.01); *H05K 3/12* (2013.01); *H05K 2201/0166* (2013.01)

(56) References Cited

U.S. PATENT DOCUMENTS

| | | |
|---|---|---|
| 2010/0230137 A1 | 9/2010 | Kobayashi et al. |
| 2016/0062242 A1 | 3/2016 | Hamaguchi et al. |

FOREIGN PATENT DOCUMENTS

| | | | | |
|---|---|---|---|---|
| JP | H0845820 A | * | 2/1996 | |
| JP | 9-160244 A | | 6/1997 | |
| JP | 2003-114525 A | | 4/2003 | |
| JP | 2003-209340 A | | 7/2003 | |
| JP | 2004-98351 A | | 4/2004 | |
| JP | 2005-187609 A | | 7/2005 | |
| JP | 2006-58797 A | | 3/2006 | |
| JP | 2008-209794 A | | 9/2008 | |
| JP | 2008209794 A | * | 9/2008 | |
| JP | 2011-241309 A | | 12/2011 | |
| JP | 2012-218318 A | | 11/2012 | |
| JP | 2012-232434 A | | 11/2012 | |
| WO | WO 2011/108665 A1 | | 9/2011 | |
| WO | WO-2011108665 A1 | * | 9/2011 | ............ C08F 220/38 |
| WO | WO 2014/178279 A1 | | 11/2014 | |

OTHER PUBLICATIONS

Office Action dated Jan. 22, 2019 in Japanese Patent Application No. 2016-547445 (with unedited computer generated English translation).

* cited by examiner

[FIG. 1]
(A)
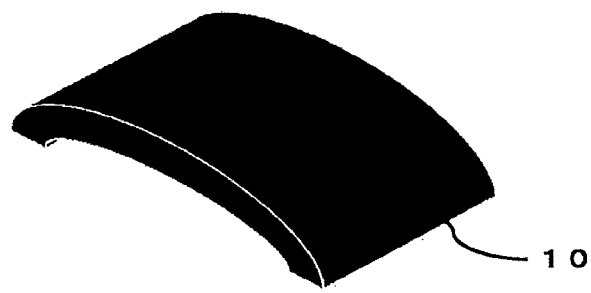
(B)
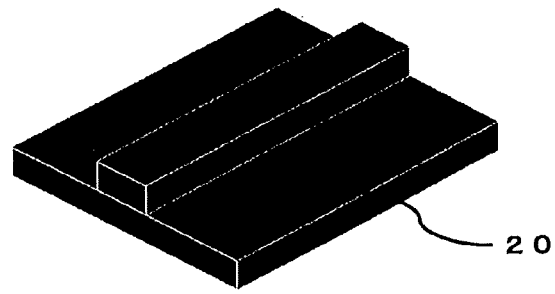
(C)
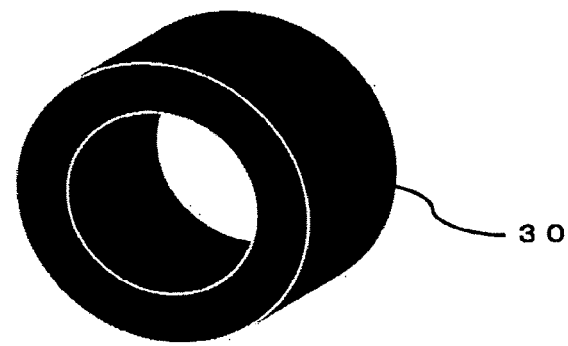

[FIG. 2]
(A)
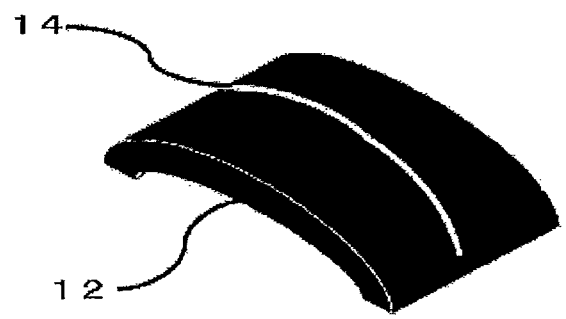
(B)
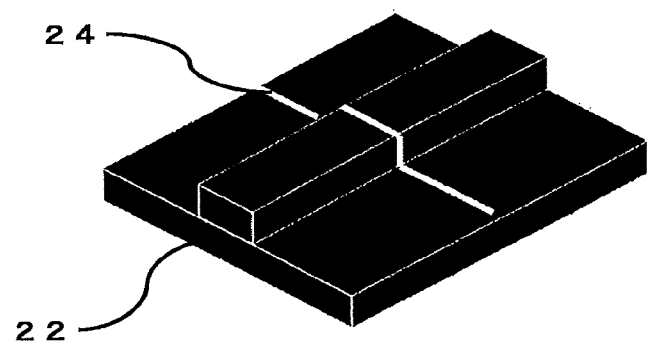
(C)
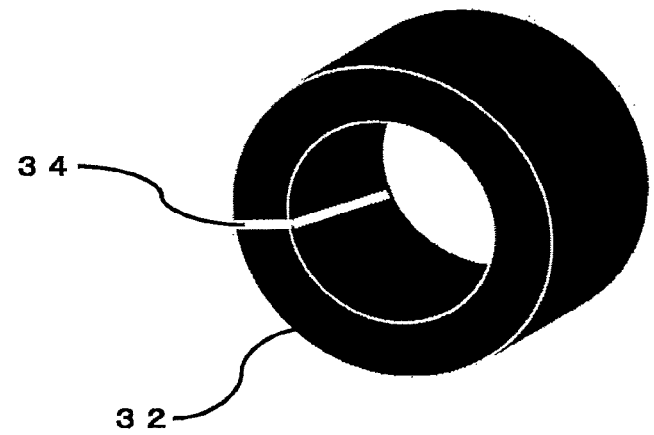

METHOD FOR MANUFACTURING STRUCTURE HAVING RECESSED PATTERN, RESIN COMPOSITION, METHOD FOR FORMING ELECTROCONDUCTIVE FILM, ELECTRONIC CIRCUIT, AND ELECTRONIC DEVICE

CROSS-REFERENCE TO RELATED APPLICATIONS

This application is a National Stage of PCT/JP2015/075441, which was filed on Sep. 8, 2015. This application is based upon and claims the benefit of priority to Japanese Application No. 2014-186567, which was filed on Sep. 12, 2014.

TECHNICAL FIELD

The present invention relates to: a method of producing a structure having a recessed pattern; a resin composition; a method of forming an electroconductive film; an electronic circuit; and an electronic device.

BACKGROUND ART

In electronic devices such as liquid crystal displays, mobile information devices such as cellular phones and tablets, digital cameras, organic EL displays, organic EL lightings, and sensors, there is a demand for a further improvement in performance in addition to size reduction and thickness reduction. As a method for producing these electronic devices less expensively, printed electronic devices in which wiring is directly printed have been attracting attention. In the production of electronic components by a printing method, since a multi-step process including exposure and development and a vacuum process such as vapor deposition can be omitted, considerable simplification of the production process is expected.

Printing methods such as ink-jet printing, screen printing, gravure printing and gravure offset printing can form a wiring with a desired pattern directly on a substrate and are thus used as simple and low-cost processes. However, the formation of a wiring with a desired pattern involves a flow of materials used for the wiring formation and this causes wet-spreading and bleeding of the materials; therefore, printing methods have a limitation in terms of forming a fine pattern with excellent linearity.

Further, the technology of forming a metal wiring by patterning a wiring-forming material through printing and subjecting the resulting wiring to thermal calcination or photocalcination has been actively studied (see, for example, Patent Document 1); however, in addition to the problem of wet-spreading and bleeding of the material at the time of printing, there is a problem in the adhesion between the resulting wiring and a substrate.

Thus, in order to solve the above-described problems so as to enable high-definition printing and thereby achieve high-definition wiring formation, the technology of arranging a layer (base layer) that serves as a wiring base has been studied. A base treatment of arranging a base layer is often performed for the purposes of inhibiting wet-spreading, bleeding and the like of a wiring-forming material applied on a substrate and thereby improving the printability.

As methods for such a base treatment, for example, a method of grafting epoxy groups to a substrate (see, for example, Patent Documents 2 and 3), a method of applying a photocatalyst on a substrate (see, for example, Patent Documents 4 and 5) and a method of applying an acrylic copolymer on a substrate (see, for example, Patent Documents 6 and 7) are known.

PRIOR ART REFERENCES

Patent Documents

[Patent Document 1] JP 2011-241309A
[Patent Document 2] JP 2003-114525A
[Patent Document 3] JP 2006-58797A
[Patent Document 4] JP 2003-209340A
[Patent Document 5] JP 2004-98351A
[Patent Document 6] JP 2012-232434A
[Patent Document 7] JP 2012-218318A

SUMMARY OF THE INVENTION

Problems to be Solved by the Invention

However, in conventional base treatments of arranging a base layer, wet-spreading and bleeding of a wiring-forming material are not sufficiently inhibited, making it difficult to form a high-definition wiring. For instance, in conventional base treatments, the base layer on which a wiring-forming material is applied has uniform surface properties. Thus, when a wiring-forming material is printed in a prescribed pattern, wet-spreading of the material from the state immediately after the printing cannot be sufficiently inhibited. Moreover, wet-spreading and bleeding of a wiring-forming material tend to occur, particularly in those cases where a base layer is formed on a structure having a non-flat surface.

As a result of intensive studies, the present inventors came to believe that a desired wiring can be formed by allowing the part where the wiring is desired to be formed to have a recessed shape in advance and then, for example, coating the part with a wiring-forming material; however, it is not easy to form a base layer having such a recess, particularly on a structure having a non-flat surface, by a conventional method.

The present invention was made in view of the above-described problems, and an object of the present invention is to provide a method of easily forming a desired recessed pattern on a structure having a non-flat surface.

Technical Solution

Under the above-described circumstances, the present inventors intensively studied to solve the above-described problems and consequently discovered that the problems can be solved by a method of producing a structure having a recessed pattern with a small film thickness of a prescribed level, thereby completing the present invention.

Examples of constitutions of the present invention are as follows.

[1] A method of producing a structure having a recessed pattern, the method comprising the following steps (1) and (ii) and the recessed pattern having a film thickness that is thinner by 5% to less than 90% with respect to that of a coating film obtained in the step (i):

(i) the step of forming a coating film on a non-flat surface of a structure using a resin composition which comprises an acid-dissociable group-containing polymer and an acid generator; and (ii) the step of forming a recess by subjecting a prescribed part of a portion of the coating film to irradiation with radiation.

[2] The production method according to [1], further comprising (iii) the step of heating the coating film after the irradiation with radiation.

[3] The production method according to [1] or [2], wherein the non-flat surface comprises at least one surface selected from the group consisting of a curved surface and an irregular surface.

[4] The production method according to any one of [1] to [3], wherein the acid-dissociable group comprises a fluorine atom.

[5] The production method according to any one of [1] to [4], wherein the difference in contact angle with respect to tetradecane between the recessed pattern part and a radiation-unirradiated part is 30° or larger.

[6] The production method according to any one of [1] to [5], wherein the acid-dissociable group is a group comprising at least one bond selected from the group consisting of an acetal bond and a hemiacetal ester bond.

[7] The production method according to any one of [1] to [6], wherein the acid-dissociable group comprises at least one group selected from the group consisting of groups represented by the following Formulae (1-1) and (1-2):

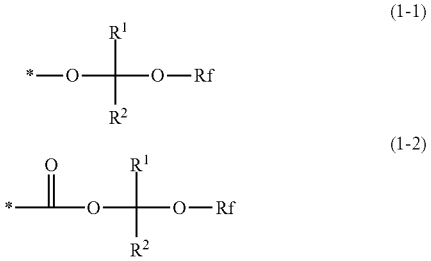

(wherein, $R^1$ and $R^2$ each independently represent a hydrogen atom or a methyl group; Rf independently represents a fluorine atom-containing organic group; and * represents a binding site).

[8] The production method according to any one of [1] to [7], wherein the resin composition comprises a polymerizable compound having an ethylenically unsaturated bond.

[9] The production method according to any one of [1] to [8], wherein the resin composition comprises at least one selected from the group consisting of structural units represented by the following Formulae (2) to (5):

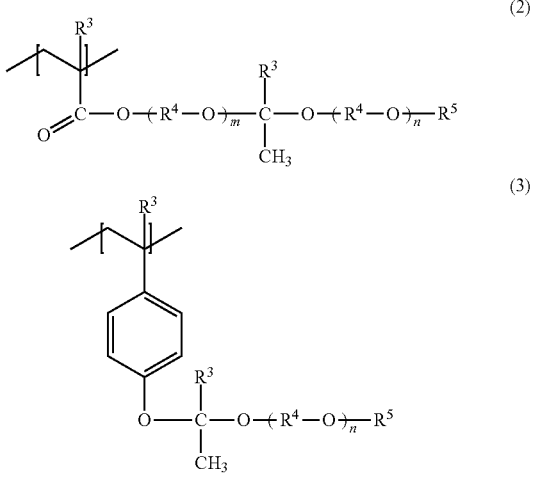

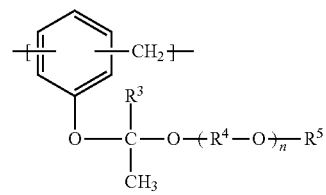

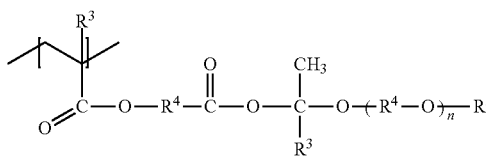

(wherein, $R^3$ independently represents a hydrogen atom or a methyl group; $R^4$ independently represents a methylene group, a C2-12 alkylene group, a C2-12 alkenylene group, a group in which the alkylene group or the alkenylene group is partially substituted with —O—, —(C=O)O— or —O(C=O)—, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom; $R^5$ independently represents a group in which at least one hydrogen atom of a hydrocarbon group is substituted with a fluorine atom; m represents 0 or 1; and n independently represents an integer of 0 to 12).

[10] A resin composition used in the production method according to any one of [1] to [9].

[11] A resin composition comprising: a polymer having a fluorine atom-containing acid-dissociable group; and an acid generator.

[12] A resin composition comprising: a polymer having an acid-dissociable group comprising at least one bond selected from the group consisting of an acetal bond and a hemiacetal ester bond; and an acid generator.

[13] A method of forming an electroconductive film, the method comprising the step of forming an electroconductive film using an electroconductive film-forming composition on a recessed pattern formed by the production method according to any one of [1] to [9].

[14] An electronic circuit comprising an electroconductive film formed by the method of forming an electroconductive film according to [13].

[15] An electronic device comprising the electronic circuit according to [14].

Advantageous Effects of the Invention

According to the present invention, a desired recessed pattern can be easily formed on a structure having a non-flat surface and, by using the structure having this recessed pattern, wet-spreading and bleeding of an electroconductive film-forming composition can be inhibited and a high-definition electroconductive film which shows excellent adhesion with the structure having the non-flat surface can be easily formed.

BRIEF DESCRIPTION OF DRAWINGS

FIG. 1(A) is a schematic view of a three-dimensional structure a used in Examples; FIG. 1(B) is a schematic view of a three-dimensional structure b used in Examples; and FIG. 1(C) is a schematic view of a three-dimensional structure c used in Examples.

FIG. 2(A) is a schematic view of the three-dimensional structure a which was obtained in Examples and has a recessed pattern or a silver wiring; FIG. 2(B) is a schematic view of the three-dimensional structure b which was obtained in Examples and has a recessed pattern or a silver wiring; and FIG. 2(C) is a schematic view of the three-dimensional structure c which was obtained in Examples and has a recessed pattern or a silver wiring.

MODE FOR CARRYING OUT THE INVENTION

<<Method of Producing Structure Having Recessed Pattern>>

The method of producing a structure having a recessed pattern according to the present invention is characterized in that it comprises the following steps (i) and (ii) and the recessed pattern has a film thickness that is thinner by 5% to less than 90% with respect to that of a coating film obtained in the step (i):

(i) the step of forming a coating film on a non-flat surface of a structure using a resin composition comprising an acid-dissociable group-containing polymer and an acid generator; and (ii) the step of forming a recess by subjecting a prescribed part of a portion of the coating film to irradiation with radiation.

According to this invention, a desired recessed pattern can be easily formed on a structure having a non-flat surface and, by using this structure having the recessed pattern, wet-spreading and bleeding of an electroconductive film-forming composition can be inhibited and a high-definition electroconductive film which shows excellent adhesion with the structure having the non-flat surface can be easily formed.

In the formation of a coating film on a structure having a non-flat surface, since the surface on which a coating film is formed is not flat, irradiation with radiation tends to result in uneven exposure. When it is tried to form a recessed pattern on such a coating film through a development step as in a conventional manner, the resulting recessed pattern is expected to be very non-uniform. Since the development step of such a structure requires a huge developing tank or the like, it is believed that the formation of a recessed pattern imposes a large process load.

Therefore, from the standpoint of, for example, enabling to easily and inexpensively produce a structure having a desired recessed pattern while drastically simplifying the steps and reducing the process load, it is preferred that the production method of the present invention include no development step.

According to the present invention, since a recessed pattern is formed through irradiation with radiation, a uniform recessed pattern having not much variation can be formed with no development step by concentrating the irradiation to those parts where radiation is not likely to reach and/or by performing the irradiation with excess radiation.

The recessed pattern formed by the production method of the present invention is desired to have a shape that has a film thickness thinner by, as a lower limit, preferably not less than 10%, more preferably not less than 11% and, as an upper limit, preferably 85% or less, more preferably 80% or less, and still more preferably 12 to 70%, with respect to the film thickness (film thickness of the radiation-unirradiated part) of the coating film obtained in the step (i).

With the resulting recessed pattern having such a shape, when an electroconductive film-forming composition is applied or the like on the coating film, because of the irregularities of the coating film surface, not only the composition is less likely to overflow from the recessed pattern but also the composition is unlikely to remain in those parts other than the recessed pattern, so that the electroconductive film-forming composition can be applied and the like in a large amount, and a high-definition electroconductive film (electroconductive film (pattern) having a width of 50 μm or less) can be obtained even when the electroconductive film-forming composition is used in a large amount.

The film thickness of the radiation-unirradiated and that of the recessed pattern can be measured specifically by the method described below in Examples.

The difference in contact angle with respect to tetradecane between the recessed pattern part (surface) and a radiation-unirradiated part (surface) (contact angle of the surface of the radiation-unirradiated part—contact angle of the surface of the recessed pattern part) is preferably 30° or larger, more preferably 40° or larger, still more preferably 50° or larger. By controlling the difference in contact angle within this range, even when a liquid-form electroconductive film-forming composition is applied or the like also on the surface of the radiation-unirradiated part at the time of forming an electroconductive film on the structure having the recessed pattern, the composition is repelled by the liquid-repellent radiation-unirradiated part and the composition is likely to move to the recessed pattern part which is lyophilic, so that an electroconductive film can be formed along the recessed pattern.

The difference in contact angle can be measured specifically by the method described below in Examples.

It is noted here that the terms "the surface of the radiation-unirradiated part" and "the surface of the recessed pattern part" used herein refer to the surface of the coating film formed on the structure, which is on the opposite side of the surface that is in contact with the structure.

Further, the reason why tetradecane is used in the measurement of the contact angle is because tetradecane is commonly used in electroconductive film-forming compositions and hardly volatile and is thus suitable for the measurement of the contact angle.

When the conditions that the resulting recessed pattern has a film thickness thinner by 5% to less than 90% with respect to that of the radiation-unirradiated part and that the difference in contact angle with respect to tetradecane between the surface of the recessed pattern part and the surface of the radiation-unirradiated part is 30° or larger are satisfied, a large amount of electroconductive film-forming composition can be easily arranged only on the recessed pattern for the same reasons as described above.

The structure having a recessed pattern obtained by the production method of the present invention is different from a structure having a semiconductor resist. A semiconductor resist, when developed, has both a part where a film is completely removed and a part where a film remains even after the development, thereby forming a pattern; however, the present invention does not involve any part where a once-formed film is completely removed, and this makes the structure of the present invention different from a structure having a semiconductor resist. The use and the like of the structure obtained by the production method of the present invention are not particularly restricted. The structure is particularly preferably used as a structure having an electroconductive film, particularly a wiring, a structure used in bioprocesses, as well as in the production of a structure which comprises an electroconductive film (wiring) having a high-definition pattern, and the like.

[Step (i)]

The step (i) is the step of forming a coating film on a non-flat surface of a structure using a resin composition which comprises an acid-dissociable group-containing polymer and an acid generator, preferably the step of forming a coating film by arranging a resin composition on a non-flat surface of a structure and subsequently heating (prebaking) the composition.

In the step (i), by using the above-described resin composition, a recess can be formed on the structure without performing a development process in the below-described step (ii) or the like.

The resin composition will be described later concretely.

The structure having a non-flat surface is not particularly restricted, and it may be any structure having a non-flat surface on which an electroconductive film or the like is desired to be formed, such as a structure having at least one surface selected from the group consisting of a curved surface and an irregular surface.

Examples of such a structure include tile-form structures, structures having a protrusion(s) and/or a recess(es), cylindrical structures, and spherical structures.

In the present invention, in cases where the resin composition is applied or the like on at least two surfaces of a prismatic article such as a cube or a rectangular parallelepiped, since these surfaces are non-flat surfaces, such a prismatic article can also be used as the structure having a non-flat surface in the step (i) as long as the resin composition is applied or the like on at least two surfaces of prismatic article.

Examples of structures comprising a non-flat surface include electrical and electronic devices, information terminal devices, home electric appliances, office automation equipments, and parts thereof; mechanical components; vehicle components; building members; and casings, parts and members of lighting instruments. Examples of the electrical and electronic devices, information terminal devices, home electric appliances, office automation equipments, and parts thereof include display devices such as personal computers, gaming machines, clocks and watches, liquid crystal televisions, organic EL televisions and electronic paper; printers; copying machines; scanners; facsimile machines; electronic organizers; various portable terminals such as PDAs (personal digital assistants), cellular phones and tablet terminals; electronic desk-top calculators; electronic dictionaries; digital cameras, video cameras, and their lenses; battery packs; drives and readout devices of recording media; computer mice; numeric keypads; portable music players; and components of these devices and equipments. Examples of the mechanical components and vehicle components include parts such as instrument panels, console boxes, glove boxes, meter panels, door ornaments, switch panels, center cluster panels, dashboards, door trims, roof trims, rear side trims, luggage room trims, and steering wheels; examples of the building members include various building materials (e.g., building materials for smart homes, such as interior walls); and examples of the lighting instruments include LED lights and organic EL lights. Examples of structures comprising a non-flat surface also include various sensors, wearable devices, and toys.

According to the present invention, a recessed pattern can be simply formed on these three-dimensional structures and, by further forming an electroconductive film on the recessed pattern, electroconductive film-equipped structures which achieve space-saving through size reduction, thickness reduction and weight reduction can be obtained. Moreover, the thus obtained electroconductive film-equipped structures are expected to have improved functions.

The material of the above-described structure can be selected as appropriate in accordance with the desired use and is not particularly restricted, and examples of the material include glass such as alkali-free glass, polyesters (e.g., polyethylene terephthalate, polybutyrene terephthalate, and polyethylene naphthalate), fluorene ring-modified polyesters, polyolefins (e.g., polyethylene and polypropylene), alicyclic polyolefins, polystyrenes, triacetyl cellulose, polyimides, fluorinated polyimides, polyamides, polyamide imides, polyether imides, polyallylates, polyether sulfones, polysulfones, polyether ether ketones, polycarbonates, fluorene ring-modified polycarbonates, alicyclic modified polycarbonates, polyvinyl chlorides, polyvinylidene chlorides, polyurethanes, poly(meth)acryloyl compounds, ring-opened cyclic olefin polymers (ROMP polymers) and their hydrogenation products, acrylonitrile-butadiene-styrene copolymer resins (ABS resins), acrylonitrile-ethylene-propylene-diene-styrene copolymer resins (AES resins), blends of the above-described polymers, and metals.

Prior to the arrangement of the resin composition on the structure, the surface of the structure may be subjected to a pre-treatment (s) such as washing, roughening and/or formation of fine surface irregularities in advance.

In the present invention, for example, a surface of a cubic or rectangular parallelepiped structure which has been subjected to such a pre-treatment (s) for roughening and/or formation of fine irregularities is not the "non-flat surface" described above, and whether or not the pre-treated surface is a non-flat surface is judged by observing the surface macroscopically.

The method of arranging the resin composition is not particularly restricted, and an appropriate method, examples of which include a wiping method using a paintbrush, brush or fabric, a dipping method, a spray method, a rotary coating method (spin coating method), a slit die coating method, a bar coating method, ink-jet printing, a dispensing method and various curved surface printing methods, can be employed. Thereamong, a spray method, a dipping method and a wiping method are particularly preferred.

The thickness of the coating film formed in the step (i) may be adjusted as appropriate in accordance with the desired use; however, it is preferably 0.1 to 20 μm, more preferably 0.2 to 10 μm.

The prebaking conditions vary depending on the formulation and the like of the resin composition to be used; however, the prebaking is preferably performed at 60 to 120° C. for 1 to 10 minutes or so.

[Step (ii)]

The step (ii) is the step of forming a recess by subjecting a prescribed part of a portion of the coating film formed in the step (i) to irradiation with radiation.

In the step (ii), a part of the coating film on the structure is irradiated with radiation, whereby a coating film comprising a radiation-irradiated part and a radiation-unirradiated part is formed.

In the present invention, since the above-described resin composition is used in the step (i), the acid-dissociable group is dissociated and volatilized by the effect of the acid generator in the step (ii). As a result, the radiation-irradiated part becomes thinner than the radiation-unirradiated part and a recess is thereby formed. In the method of producing a structure having a recessed pattern according to the present invention, basically, the film thickness of the radiation-unirradiated part does not change after the coating film formation.

At this point, if the acid-dissociable group contains a fluorine atom, the coating film obtained in the step (i) and the radiation-unirradiated part exhibit liquid repellency; however, as the acid-dissociable group disappears, the radiation-irradiated part (recess) becomes lyophilic as compared to the radiation-unirradiated part.

Thus, in cases where a composition which contains a compound containing an acid-dissociable group having a fluorine atom is used as the resin composition in the step (i), a coating film having a liquid-repellent radiation-unirradiated part (protruded part) and a radiation-irradiated part, which is a recess (recessed pattern) more lyophilic than the radiation-unirradiated part, is formed on the structure by the step (ii). Further, when an electroconductive film-forming composition such as an electroconductive film-forming ink is applied onto such a coating film by dropwise addition, dipping, spray coating or printing, the irregularities on the coating film surface allow the composition to more easily collect on the recess and, since the composition is thus more likely to collect on the recess (patterning of the electroconductive film-forming composition is assisted) due to not only the effect of the surface shape of this coating film but also the lyophilic and liquid-repelling properties of the surface, an electroconductive film (wiring) of a more desirable shape, specifically a fine and elaborate electroconductive film (wiring), is more likely to be formed on the structure.

Moreover, in cases where a composition which contains a compound containing an acid-dissociable group having a fluorine atom is used as the resin composition in the step (i), the group having the fluorine atom is dissociated by the irradiation with radiation and, since this dissociated group is relatively easily volatilized, a coating film having a large thickness difference between the radiation-unirradiated part and the recess can be formed more simply in the step (ii).

In the step (ii), it is preferred to draw and expose a prescribed pattern through a photomask or mask seal having the prescribed pattern or using a direct-drawing exposure apparatus such that a recess having the same shape as that of the desired recessed pattern is formed.

Further, as for the irradiation with radiation, from the standpoint of, for example, forming a recess having a narrow line width, it is preferred that radiation be irradiated from the side of the coating film formed in the step (i).

In the present invention, as the radiation for exposure, for example, visible light, ultraviolet rays, far ultraviolet rays, charged particle beams and X rays can be used. Thereamong, radiations having a wavelength in a range of 190 nm to 450 nm are preferred, and radiations containing an ultraviolet ray of 365 nm are particularly preferred.

As for the exposure dose in the step (ii), it is preferred that the radiation be irradiated such that the film thickness of the resulting recessed pattern (recess) with respect to that of the radiation-unirradiated part is controlled in the above-described range. Specifically, the intensity of the radiation measured at a wavelength of 365 nm by an illuminometer (OAI model 356, manufactured by OAI Optical Associates Inc.) is preferably 10 mJ/cm$^2$ to 1,000 mJ/cm$^2$, more preferably 20 mJ/cm$^2$ to 700 mJ/cm$^2$.

[Step (iii)]

In the present invention, the recess formed in the step (ii) may be a recessed pattern formed on the structure and, from the standpoint of, for example, further increasing the depth of the recess (a further reduction in the film thickness of the recess), it is preferred that the production method of the present invention comprise the step (iii) of heating the radiation-irradiated coating film obtained in the step (ii).

In cases where the step (iii) is performed, a structure having a recessed pattern is produced by this step.

Since the above-described resin composition is used in the step (i), by the step (iii), the component generated in the radiation-irradiated part in the step (ii) as a result of the dissociation of the acid-dissociable group due to the effect of the acid generator can be further volatilized. Consequently, the depth of the recess is further increased (the film thickness of the recess is further reduced), so that a coating film having a shape in which the recess is thinner by 5% to less than 90% with respect to thickness of the above-described protruded part can be easily formed.

In cases where a composition which contains a compound having a chemical bond that is cleaved by irradiation with radiation is used as the resin composition in the step (i), the chemical bond of the compound contained in the coating film is cleaved by the irradiation with radiation performed in the step (ii), and the thus cleaved compound can be efficiently removed by the step (iii), whereby a recess pattern is formed.

Specific examples of the compound having a chemical bond that is cleaved by irradiation with radiation include compounds having a chemical bond that is cleaved when irradiated with a radiation containing a wavelength of 150 to 450 nm, preferably a short wavelength of 150 to 365 nm, at 10 to 1,000 mJ/cm$^2$.

Further, in cases where a composition which contains a component that is photo-crosslinked by irradiation with radiation and undergoes cure-shrinking and the like in association with the crosslinking is used as the resin composition in the step (i), the depth of the recess formed in the step (ii) can be further increased by subjecting the coating film obtained in the step (ii) to heating in the step (iii), whereby a desired recessed pattern can be formed.

In cases where a composition which contains a compound containing an acid-dissociable group having a fluorine atom is used as the resin composition in the step (i), a coating film having a liquid-repellent radiation-unirradiated part (protruded part) and a recessed pattern more lyophilic than the radiation-unirradiated part is formed on a substrate by the step (iii). Further, when an electroconductive film-forming composition such as an electroconductive film-forming ink is applied onto such a coating film by dropwise addition, dipping, spray coating or printing, because of a large thickness difference between the protruded part and the recessed pattern, the irregularities on the coating film surface allow the composition to more easily collect on the recessed pattern and, since the composition is thus more likely to collect on the recessed pattern (patterning of the electroconductive film-forming composition is assisted) due to not only the effect of the surface shape of this coating film but also the lyophilic and liquid-repelling properties of the surface, an electroconductive film of a more desirable shape, specifically a fine and elaborate electroconductive film, is more likely to be formed on the structure.

Moreover, in cases where a composition which contains a compound containing an acid-dissociable group having a fluorine atom is used as the resin composition in the step (i), the group having the fluorine atom is dissociated by the irradiation with radiation and, since this dissociated group is relatively easily volatilized, a coating film having a large thickness difference between the radiation-unirradiated part and the recessed pattern can be formed more simply in the step (iii).

Examples of a method of heating the coating film in the step (iii) include a method of heating the coating film-equipped structure obtained in the step (ii) using a hot plate, a batch-type oven or a conveyor-type oven, a hot-air drying method using a dryer or the like, and a vacuum baking method.

The conditions of the heating vary depending on, for example, the formulation of the resin composition used in the step (i) and the thickness of the coating film obtained in the step (ii); however, the heating is preferably performed such that the thickness of the recessed pattern formed in the step (iii) with respect to that of the radiation-unirradiated part is controlled in the above-described range and preferably performed at 60 to 150° C. for 3 to 60 minutes or so.

The film thickness of the recessed pattern obtained in the step (iii) may be adjusted as appropriate in accordance with the desired use; however, it is preferably in the above-described range with respect to the film thickness of the radiation-unirradiated part, more preferably 0.01 to 18 μm, still more preferably 0.05 to 15 μm.

<<Method of Forming Electroconductive Film>>

The method of forming an electroconductive film according to the present invention is characterized by comprising the step of forming an electroconductive film using an electroconductive film-forming composition on a recessed pattern formed by the above-described method of producing a structure having a recessed pattern.

According to this method of forming an electroconductive film, not only a high-definition electroconductive film (wiring) can be easily formed on a structure having a non-flat surface but also an electroconductive film (wiring) having a width of 10 μm or less, for example, about 1 μm, which is not possible to form easily by a conventional method, can be easily formed on a structure having a non-flat surface.

Specifically, the method of forming an electroconductive film according to the present invention can be suitably applied as a method of forming an electroconductive film in, for example, display devices such as personal computers, gaming machines, clocks and watches, liquid crystal televisions, organic EL televisions and electronic paper; printers; copying machines; scanners; facsimile machines; electronic organizers; various portable terminals such as PDAs, cellular phones and tablet terminals; electronic desk-top calculators; electronic dictionaries; digital cameras, video cameras, and their lenses; battery packs; drives and readout devices of recording media; computer mice; numeric keypads; portable music players; vehicle components such as instrument panels, console boxes, glove boxes, meter panels, door ornaments, switch panels, center cluster panels, dashboards, door trims, roof trims, rear side trims, luggage room trims and steering wheels; various building materials (e.g., building materials for smart homes, such as interior walls); LED lights; and organic EL lights. Further, the method of forming an electroconductive film according to the present invention can also be suitably applied as a method of forming an electroconductive film in various sensors, wearable devices, toys and the like.

Specifically, it is preferred that the above-described method of forming an electroconductive film comprise the step (iv) of arranging an electroconductive film-forming composition on the above-described recessed pattern and subsequently subjecting the composition to heating and/or irradiation with radiation.

The electroconductive film-forming composition will be described later concretely.

The method of arranging the electroconductive film-forming composition is not particularly restricted, and an appropriate method, examples of which include a coating method using a paintbrush or a brush, a dropping method, a dipping method, a spray method, a rotary coating method (spin coating method), a slit die coating method, a bar coating method, a squeegeeing method, ink-jet printing, a dispensing method and various curved surface printing methods, can be employed. Thereamong, a dropping method, a dipping method and a spray method are particularly preferred.

In cases where a composition which contains a compound containing an acid-dissociable group having a fluorine atom is used as the resin composition in the step (i), since a liquid-repellent radiation-unirradiated part and a recessed pattern part more lyophilic than the radiation-unirradiated part are formed by the above-described production method, when a liquid-form electroconductive film-forming composition is used by any of the above-described methods, the composition is repelled by the radiation-unirradiated part and thus likely to collect on the recessed pattern part, so that a state in which the composition is arranged along the recessed pattern is likely to be created.

The heating temperature in the step (iv) is not particularly restricted; however, it is preferably not higher than 190° C. When a structure made of a poorly heat-resistant material such as polyethylene terephthalate is used as the above-described structure, the heating temperature is preferably not higher than the heat resistance temperature of the structure, specifically not higher than 150° C.

The heating time is also not particularly restricted; however, it is preferably 1 to 120 minutes, more preferably 3 to 60 minutes.

Examples of a method of the heating include a heating method using a hot plate, a batch-type oven, a conveyor-type oven or the like, a hot-air drying method using a dryer or the like, and a vacuum baking method.

The conditions of the irradiation with radiation performed in the step (iv) are not particularly restricted; however, the irradiation is performed using a flash lamp or the like at a dose of preferably 500 to 6,000 mJ/cm$^2$, more preferably 1,000 to 5,000 mJ/cm$^2$.

In the above-described method of forming an electroconductive film, after the step of forming an electroconductive film, preferably after the step (iv), the step (v) of removing the radiation-unirradiated part formed in the step (i) from the thus obtained electroconductive film-equipped structure by irradiation with radiation or heating may be performed as required.

The step (v) is preferably (a) the step of heating the structure at a temperature higher than the heating temperature used in the step (iv), or (b) the step of irradiating the protruded part of the electroconductive film-equipped structure obtained in the step (iv) (the radiation-unirradiated part formed in the step (i)) with radiation under the same conditions as in the step (ii) and subsequently heating the structure under the same conditions as in the step (iii).

In the step (v), it is preferred that the protruded part be removed such that the protruded part existing after the step (iv) has the same film thickness as that of the recessed pattern.

Examples of a heating method used in the step (v) include a heating method using a hot plate, a batch-type oven, a conveyor-type oven or the like, a hot-air drying method using a dryer or the like, and a vacuum baking method.

In any of the above-described steps, the atmosphere under which the heating is performed may be selected as appropriate in accordance with the type of the electroconductive film-forming composition to be used and is not particularly restricted. The heating may be performed in the air, under reduced pressure, in a non-oxidizing atmosphere, or in a reducing atmosphere. Examples of the non-oxidizing atmosphere include a nitrogen atmosphere, a helium atmosphere, and an argon atmosphere. Thereamong, a nitrogen atmosphere is preferred since an inexpensive nitrogen gas can be used. Examples of the reducing atmosphere include reducing gas atmospheres such as hydrogen gas.

As for the heating conditions in the above-described (a), taking into consideration the electroconductive film-forming composition and structure to be used, it is preferred that the heating be performed at such a temperature that allows the protruded part to be decomposed or volatilized, preferably 120 to 300° C., more preferably 150 to 250° C.

The heating time in the above-described (a) is not particularly restricted as long as the heating is performed at such a temperature that allows the protruded part to be decomposed or volatilized. For example, when the heating temperature is set at about 250° C., the heating time is preferably 3 to 15 minutes or so; when the heating temperature is set at about 200° C., the heating time is preferably 5 to 30 minutes or so; and when the heating temperature is set at about 150° C., the heating time is preferably 10 to 60 minutes or so.

<<Electronic Circuit and Electronic Device>>

The electronic circuit of the present invention comprises an electroconductive film formed by the above-described method of forming an electroconductive film, preferably a laminate of an electroconductive film formed by the above-described method of forming an electroconductive film and the above-described structure. That is, the electronic circuit of the present invention comprises: a structure having a non-flat surface on which a coating film having a part thinner than the rest by 5% to less than 90% (recessed pattern part) is formed; and an electroconductive film formed on the recessed pattern part.

The electronic circuit of the present invention may also be a laminate of an electroconductive film formed by the above-described method of forming an electroconductive film and the above-described structure, on which laminate a conventionally known layer(s), for example, a protective film that protects the electroconductive film and/or an insulating film, are further laminated.

The electronic device of the present invention comprises the above-described electronic circuit. Therefore, the electronic device of the present invention is reduced in size and thickness and has improved functions.

Examples of the electronic device include touch panels, liquid crystal displays, portable information devices such as cellular phones, digital cameras, organic displays, organic EL lights, various sensors, and wearable devices.

[Resin Composition]

The above-described resin composition is a composition which comprises an acid-dissociable group-containing polymer (hereinafter, also referred to as "polymer [A]") and an acid generator (hereinafter, also referred to as "acid generator [C]").

Such a composition is preferred because a coating film formed therefrom is volatilized or decomposed by irradiation with radiation and heating performed as required.

Such a composition can be suitably used as a base layer-forming composition for forming a highly precise pattern on the above-described structure while inhibiting bleeding of an electroconductive film-forming composition, and as a composition for forming a base layer which improves the adhesion between an electroconductive film (wiring) and the above-described structure.

The resin composition may further contain a solvent (hereinafter, also referred to as "solvent [B]"). Incorporation of the solvent [B] allows the composition to take a liquid form, so that a coating film can be easily formed by a coating or immersion process.

The resin composition may further contain a sensitizer (hereinafter, also referred to as "sensitizer [D]") as an auxiliary material of the acid generator [C] and may also contain a quencher (hereinafter, also referred to as "quencher [E]") as a material for inhibiting the diffusion of acid from the acid generator [C].

Further, the resin composition may contain a polymerizable compound having an ethylenically unsaturated bond which is different from the polymer [A] (hereinafter, also be referred to as "polymerizable compound [F]") and may also contain a radiation-sensitive polymerization initiator (hereinafter, also referred to as "radiation-sensitive polymerization initiator [G]").

Moreover, in the resin composition, other optional components can be incorporated as long as they do not impair the effects of the present invention.

The viscosity of the resin composition (temperature: 20° C., shear rate: 10 sec$^{-1}$) may be adjusted based on the desired method of arranging the resin composition and the desired thickness and the like of the coating film to be formed. In cases where a 0.5 to 2 μm-thick coating film is to be formed using a spin coating method as the method of arranging the resin composition, the viscosity of the resin composition is, for example, preferably 5 cP (0.005 Pa·s) to 20 cP (0.02 Pa·s) and, in cases where a spray coating method is used as the method of arranging the resin composition, the viscosity of the resin composition is, for example, 1 cP (0.001 Pa·s) to 10 cP (0.01 Pa·s).

<[A] Acid-dissociable Group-containing Polymer>

The polymer [A] is not particularly restricted as long as it is a polymer which contains a group having a property of dissociating with an acid.

The acid-dissociable group is preferably a group containing a fluorine atom. This is because, by allowing the polymer [A] having such a group, a liquid-repellent coating film can be formed in the step (i); a liquid-repellent radiation-unirradiated part and a recess (recessed pattern) that is more lyophilic than the radiation-unirradiated part can be easily formed through the subsequent step (ii) and the like; and a high-definition electroconductive film can be formed by carrying out the subsequent steps (iv) and (v) and the like.

From the standpoint of, for example, forming a high-definition electroconductive film, the acid-dissociable group is more preferably a group comprising a group having at least one bond selected from the group consisting of an acetal bond and a hemiacetal ester bond, particularly preferably at least one group selected from the group consisting of groups represented by the following Formulae (1-1) and (1-2):

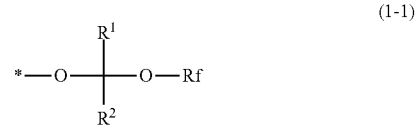

(1-1)

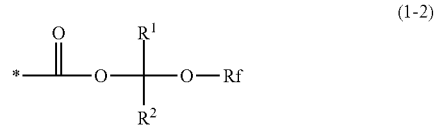

(1-2)

(wherein, $R^1$ and $R^2$ each independently represent a hydrogen atom or a methyl group; Rf independently represents a fluorine atom-containing organic group; and * represents a binding site).

An acetal bond-containing polymer can be obtained by allowing an alcohol to react with a compound having a $CH_2=C(R^1)-O-$ group, and a hemiacetal ester bond-containing polymer can be obtained by allowing a carboxylic acid to react with a compound having a $CH_2=C(R^1)-O-$ group.

As the Rf, groups represented by the following Formulae (1-1) to (1-33), a 2,2,2-trifluoroethyl group and a 1,2,2-trifluorovinyl group are preferred.

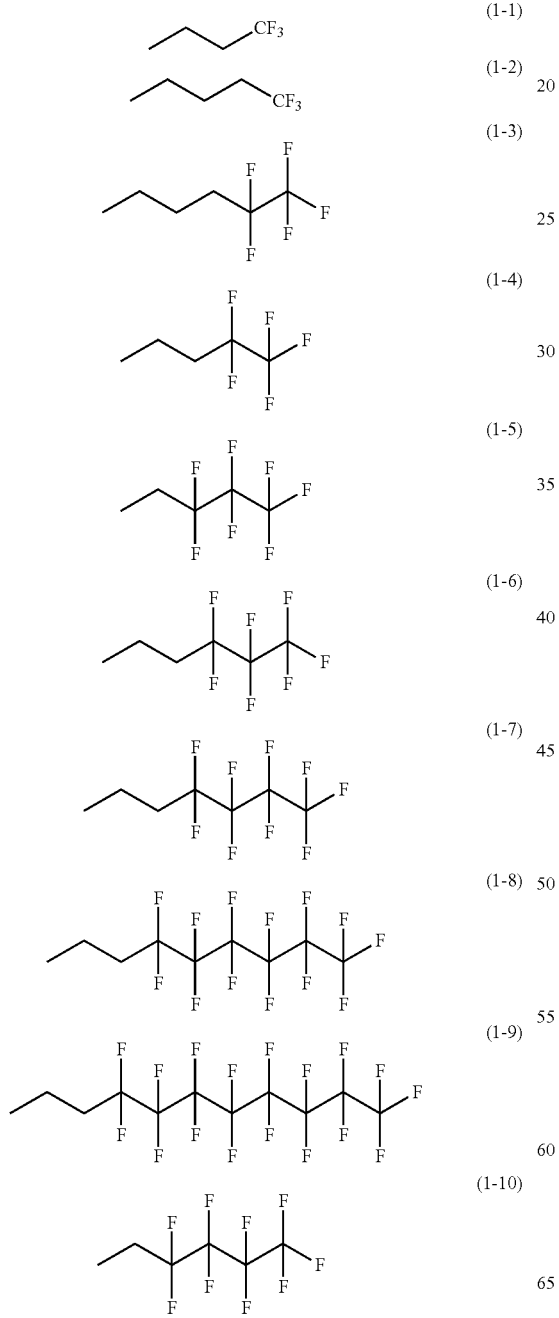

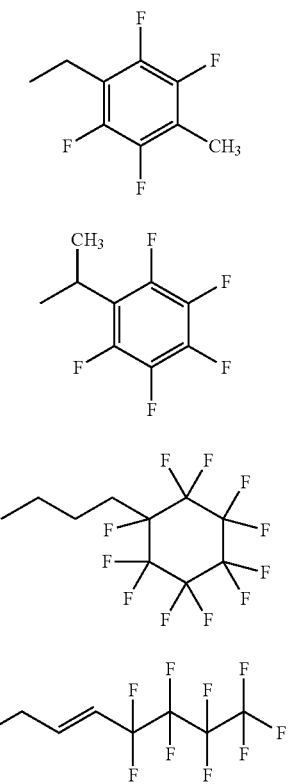

(1-22)
(1-23)
(1-24)
(1-25)
(1-26)
(1-27)

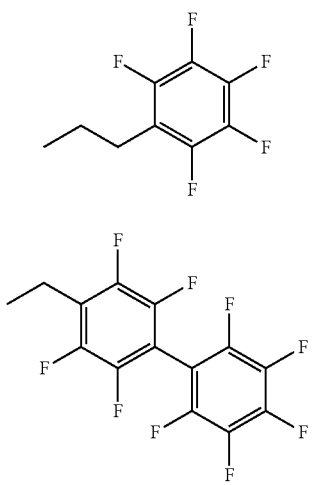

(1-28)

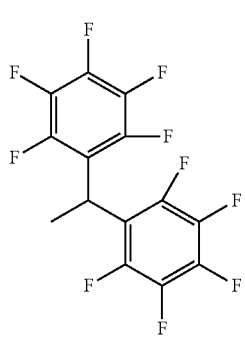

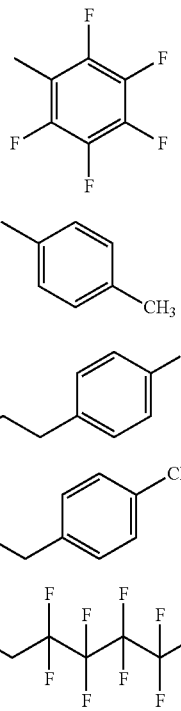

(1-29)
(1-30)
(1-31)
(1-32)
(1-33)

The polymer [A] is preferably a compound having a structure in which a protecting group derived from a vinyl ether compound represented by the following Formula (1) (hereinafter, also referred to as "compound (1)") is introduced to a hydroxyl group of a hydroxyl group-containing precursor compound. Alternatively, the polymer [A] may be a compound having a structure in which a protecting group derived from the compound (1) is introduced to a carboxyl group of a carboxyl group-containing precursor compound.

These compounds (hereinafter, also referred to as "compounds (a)"), particularly the compound in which a protecting group is introduced to a hydroxyl group of a hydroxyl group-containing compound, can be suitably used as the polymer [A] because they have properties that dissociation of the protecting group due to heat is unlikely to occur while dissociation of the protecting group caused by radiation can be controlled. Further, the compounds (a) are preferred because, when used in combination with the below-described acid generator [C], the combination enables to more precisely control the dissociation of the protecting group caused by radiation.

$$\overset{R^0}{\underset{}{\diagup}}\!\!-\!\!O\!\!-\!\!(\!R^A\!\!-\!\!O\!)_{\!x}\!\!-\!\!R^B \quad (1)$$

In the Formula (1), $R^0$ represents a hydrogen atom or a methyl group.

In the Formula (1), $R^A$ independently represents a methylene group, a C2-12 alkylene group, a C2-12 alkenylene group, a group in which the alkylene group or the alkenylene group is partially substituted with —O—, —(C=O)O— or —O(C=O)—, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom.

Examples of the C2-12 alkylene group represented by $R^A$ include an ethylene group, a propylene group, a butylene group, a pentylene group, a hexylene group, a heptylene group, an octylene group, a nonylene group, a decylene group, an undecylene group, and a dodecylene group.

Examples of the C2-12 alkenylene group represented by $R^A$ include a vinylene group, an ethene-1,2-diyl group, and a 2-butene-1,4-diyl group.

Examples of the group in which the alkylene group or the alkenylene group is partially substituted with —O—, —(C=O)O— or —O(C=O)— (provided that the maximum number of carbon atoms is 12), which is represented by $R^A$, include —$R^C$—O—$R^C$—, —$R^C$—(C=O)O—$R^C$—, and —$R^C$—O(C=O)—$R^C$— (wherein $R^C$s each independently represent an alkylene group or an alkenylene group).

Examples of the C6-13 substituted or unsubstituted aromatic hydrocarbon group represented by $R^A$ include a phenylene group, a tolylene group, a mesitylene group, a naphtylene group, and a biphenylene group.

Examples of the C4-12 substituted or unsubstituted alicyclic hydrocarbon group represented by $R^A$ include a cyclobutyl group, a cyclopentyl group, a cyclohexyl group, a cycloheptyl group, and a bicyclohexyl group.

Examples of the group in which at least one hydrogen atom of a methylene group, a C2-12 alkylene group, a C2-12 alkenylene group, a C6-13 substituted or unsubstituted aromatic hydrocarbon group or a C4-12 substituted or unsubstituted alicyclic hydrocarbon group is substituted with a fluorine atom, which group is represented by $R^A$, include those groups in which at least one hydrogen atom of any one of the above-exemplified groups is substituted with a fluorine atom.

The $R^A$ is preferably a methylene group, an ethylene group, a propylene group, a butylene group, a pentamethylene group, a hexamethylene group, a phenylene group, or a vinylene group.

In the Formula (1), $R^B$ represents a group in which at least one hydrogen atom of a hydrocarbon group is substituted with a fluorine atom.

In the Formula (1), examples of the $R^B$ include groups represented by the Formulae (1-1) to (1-33), a 2,2,2-trifluoroethyl group and a 1,2,2-trifluorovinyl group, and the $R^B$ is preferably a 2,2,2-trifluoroethyl group, a 3,3,3-trifluoropropyl group represented by the Formula (1-1), a 4,4,4-trifluorobutyl group represented by the Formula (1-2), a 3,3,4,4,4-pentafluorobutyl group represented by the Formula (1-4), a 4,4,5,5,6,6,6-heptafluorohexyl group represented by the Formula (1-16), a 3,3,4,4,5,5,6,6,6-nonafluorohexyl group represented by the Formula (1-7), a 3,3,4,4,5,5,6,6,7,7,8,8,8-tridecafluorooctyl group represented by the Formula (1-8), a 3,3,4,4,5,5,6,6,7,7,8,8,9,9,10,10,10-heptadecafluorodecyl group represented by the Formula (1-9), a 1,2,2-trifluorovinyl group, or a 2,3,4,5,6-pentafluorophenyl group represented by the Formula (1-29).

In the Formula (1), x represents an integer of 0 to 12, preferably an integer of 0 to 9, more preferably 0.

Since the resin composition used in the step (i) contains the polymer [A], the coating film formed in the step (i) exhibits properties based on the polymer [A] and, when the compound (a) is used as the polymer [A], the coating film exhibits properties attributed to the protecting group of the compound (a). Specifically, when a coating film is formed from a resin composition containing the compound (a), first, a liquid-repellent coating film is formed in the step (i) and, when this coating film is subsequently irradiated with radiation, the protecting group is dissociated in the exposed part while vinyloxy groups and hydroxyl groups remain in the part where the protecting group has been dissociated, so that the liquid repellency attributed to the protecting group is lost.

Next, methods for obtaining the polymer [A] will be described. The polymer [A] can be obtained by two methods: a method of using a polymer as a precursor compound; and a method of using a monomer as a precursor compound.

In the method of using a polymer as a precursor compound, the polymer serving as a precursor contains a hydroxyl group or a carboxyl group in the molecule, and the polymer [A] can be obtained by allowing the compound (1) to react with the hydroxyl group or the carboxyl group of the polymer serving as a precursor.

Meanwhile, in the method of using a monomer as a precursor compound, the monomer serving as a precursor contains a hydroxyl group or a carboxyl group in the molecule, and the polymer [A] can be obtained by allowing the compound (1) to react with the hydroxyl group or the carboxyl group of the monomer serving as a precursor and subsequently polymerizing the resulting monomer.

These two methods for obtaining the polymer [A] will now be described more concretely.
(1) Method of Using Polymer as Precursor Compound In this method, a monomer having a hydroxyl group or a carboxyl group is polymerized to prepare a polymer (precursor) having a hydroxyl group or a carboxyl group and the compound (1) is subsequently allowed to react with the hydroxyl group or the carboxyl group of the thus obtained precursor polymer, whereby the polymer [A] can be obtained. The polymer [A] can also be obtained by preparing a polymer (precursor) having a hydroxyl group or a carboxyl group in accordance with a conventionally known method, such as a method of allowing a phenol and formaldehyde to react with each other, and subsequently allowing the compound (1) to react with the hydroxyl group or the carboxyl group of the thus obtained precursor polymer.

The monomer having a hydroxyl group is preferably a (meth)acrylic acid ester, and examples thereof include 2-hydroxyethyl methacrylate, 2-hydroxypropyl methacrylate, 2-hydroxyethyl acrylate, 2-hydroxypropyl acrylate, 2-hydroxybutyl methacrylate, 2-hydroxybutyl acrylate, 2-hydroxy-3-phenoxypropyl acrylate, 2-acryloyloxyethyl-2-hydroxyethyl phthalate, dipropylene glycol methacrylate, dipropylene glycol acrylate, 4-hydroxybutyl methacrylate, 4-hydroxybutyl acrylate, cyclohexanedimethanol monoacrylate, cyclohexanedimethanol monomethacrylate, ethyl α-(hydroxymethyl)acrylate, polypropylene glycol monomethacrylate, polypropylene glycol monoacrylate, glycerol monomethacrylate, glycerol monoacrylate, polyethylene glycol monomethacrylate, polyethylene glycol monoacrylate, poly(ethylene glycol-propylene glycol)monomethacrylate, poly(ethylene glycol-propylene glycol)monoacrylate, polyethylene glycol-polypropylene glycol monomethacrylate, polyethylene glycol-polypropylene glycol monoacrylate, poly(ethylene glycol-tetramethylene glycol)monomethacrylate, poly(ethylene glycol-tetramethylene glycol)monoacrylate, polypropylene glycol-tetramethylene glycol)monomethacrylate, poly(propylene glycol-tetramethylene glycol)monoacrylate, propylene glycol polybutylene glycol monomethacrylate, propylene glycol polybutylene glycol monoacrylate, p-hydroxyphenyl methacrylate, p-hydroxyphenyl acrylate and vinylphenol, as well as the following products manufactured by Daicel Corporation: PLACCEL FM1, PLACCEL FM1D, PLACCEL FM2D, PLACCEL FM3, PLACCEL FM3X, PLACCEL FM4, PLACCEL FM5, PLACCEL FA1, PLACCEL FA1DDM, PLACCEL FA2D, PLACCEL FA5 and PLACCEL FA10L.

Examples of the monomer having a carboxyl group include acrylic acid, methacrylic acid, 2-acryloyloxyethylsuccinic acid, 2-methacryloyloxyethylsuccinic acid, 2-acryloyloxyethylphthalic acid, 2-methacryloyloxyethylphthalic acid, 2-acryloyloxyethyl tetrahydrophthalic acid, 2-methacryloyloxyethyl tetrahydrophthalic acid, 2-acryloyloxyethyl hexahydrophthalic acid, 2-methacryloyloxyethyl hexahydrophthalic acid, 2-acryloyloxypropylphthalic acid, 2-methacryloyloxypropylphthalic acid, 2-acryloyloxypropyl tetrahydrophthalic acid, 2-methacryloyloxypropyl tetrahydrophthalic acid, 2-acryloyloxypropyl hexahydrophthalic acid, and 2-methacryloyloxypropyl hexahydrophthalic acid.

The polymer having a hydroxyl group or a carboxyl group, which serves as a precursor of the polymer [A], can be obtained not only by using only the above-described monomer having a hydroxyl group or a carboxyl group, but also by copolymerizing the above-described monomer having a hydroxyl group or a carboxyl group with other monomer different from the monomer having a hydroxyl group or a carboxyl group. Examples of other monomer different from the monomer having a hydroxyl group or a carboxyl group include (meth)acrylic acid linear alkyl esters, (meth)acrylic acid cyclic alkyl esters, (meth)acrylic acid aryl esters, unsaturated aromatic compounds, conjugated dienes, unsaturated compounds containing a tetrahydrofuran skeleton, maleimides, and monomers other than the above-described ones.

More concretely, examples of the (meth)acrylic acid linear alkyl esters include methyl methacrylate, ethyl methacrylate, n-butyl methacrylate, sec-butyl methacrylate, t-butyl methacrylate, 2-ethylhexyl methacrylate, isodecyl methacrylate, n-lauryl methacrylate, tridecyl methacrylate, n-stearyl methacrylate, methyl acrylate, ethyl acrylate, n-butyl acrylate, sec-butyl acrylate, t-butyl acrylate, 2-ethylhexyl acrylate, isodecyl acrylate, n-lauryl acrylate, tridecyl acrylate, and n-stearyl acrylate.

Examples of the (meth)acrylic acid cyclic alkyl esters include cyclohexyl methacrylate, 2-methylcyclohexyl methacrylate, tricyclo[5.2.1.0$^{2,6}$]decan-8-yl methacrylate, isobornyl (meth)acrylate, cyclohexyl acrylate, 2-methylcyclohexyl acrylate, tricyclo[5.2.1.0$^{2,6}$]decan-8-yl acrylate, and isobornyl acrylate.

Examples of the (meth)acrylic acid aryl esters include phenyl methacrylate, benzyl methacrylate, phenyl acrylate, and benzyl acrylate.

Examples of the unsaturated aromatic compounds include styrene, α-methylstyrene, o-methylstyrene, m-methylstyrene, p-methylstyrene, and p-methoxystyrene.

Examples of the conjugated dienes include 1,3-butadiene, isoprene, and 2,3-dimethyl-1,3-butadiene.

Examples of the unsaturated compounds containing a tetrahydrofuran skeleton include tetrahydrofurfuryl (meth)acrylate, 2-methacryloyloxy-propionic acid tetrahydrofurfuryl ester, and 3-(meth)acryloyloxytetrahydrofuran-2-one.

Examples of the maleimides include N-phenylmaleimide, N-cyclohexylmaleimide, N-tolylmaleimide, N-naphthylmaleimide, N-ethylmaleimide, N-hexylmaleimide, and N-benzylmaleimide.

Further, examples of the monomers other than the above-described ones include glycidyl methacrylate, 3,4-epoxycyclohexylmethacrylate, 3,4-epoxycyclohexylacrylate, 3-(methacryloyloxymethyl)-3-ethyloxetane, 3-(acryloyloxymethyl)-3-ethyloxetane, tricyclo[5.2.1.0$^{2,6}$]decan-8-yloxyethyl methacrylate, and tricyclo[5.2.1.0$^{2,6}$]decan-8-yloxyethyl acrylate.

In the synthesis of the polymer having a hydroxyl group or a carboxyl group which serves as a precursor of the polymer [A], a solvent may be used, and examples thereof include alcohols, glycol ethers, ethylene glycol alkyl ether acetates, diethylene glycol monoalkyl ethers, diethylene glycol dialkyl ethers, dipropylene glycol dialkyl ethers, propylene glycol monoalkyl ethers, propylene glycol alkyl ether acetates, propylene glycol monoalkyl ether propionates, ketones, and esters.

In the polymerization reaction for obtaining the polymer having a hydroxyl group or a carboxyl group which serves as a precursor of the polymer [A], a molecular weight regulator can be used for the purpose of adjusting the molecular weight. Examples of the molecular weight regulator include halogenated hydrocarbons such as chloroform and carbon tetrabromide; mercaptans such as n-hexyl mercaptan, n-octyl mercaptan, n-dodecyl mercaptan, t-dodecylmercaptan and thioglycolic acid; xanthogens such as dimethylxanthogen sulfide and diisopropylxanthogen disulfide; terpinolene; and a-methylstyrene dimer.

The weight-average molecular weight (Mw) of the polymer having a hydroxyl group or a carboxyl group in terms of polystyrene, which is determined by gel permeation chromatography (GPC), is preferably 1,000 to 40,000, more preferably 5,000 to 30,000. By controlling the Mw of the polymer having a hydroxyl group or a carboxyl group in the above range, the sensitivity of the resin composition containing the polymer [A] having this molecular weight can be improved.

The method of obtaining the polymer [A] by allowing the compound (1) to react with the hydroxyl group or the carboxyl group of the polymer having a hydroxyl group or a carboxyl group can be carried out by allowing the hydroxyl group or the carboxyl group to react with a vinyl ether group as represented by the following formula.

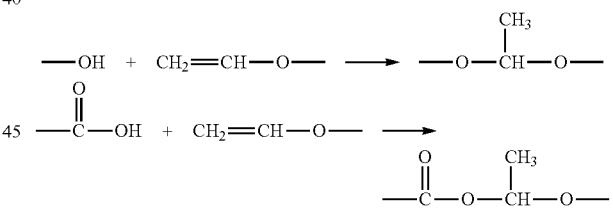

For the method of obtaining the polymer [A], reference can be made to known methods, such as the method described in JP 2005-187609A.

Specifically, an adduct is formed by generating an acetal bond from the hydroxyl group of the polymer having a hydroxyl group and the vinyl ether group of the compound (1) or by generating a hemiacetal ester bond from the carboxyl group of the polymer having a carboxyl group and the vinyl ether group of the compound (1).

For example, the polymer having a hydroxyl group or a carboxyl group is dissolved in an appropriate organic solvent, and the compound (1) is subsequently added thereto in an equimolar or excess amount with respect to the hydroxyl group or the carboxyl group of the polymer. The resulting reaction mixture is cooled to a temperature of 0° C. to about room temperature (25° C.), and an acid dissolved in the same solvent as the above-described organic solvent (e.g., an oxalic acid solution) is subsequently added thereto dropwise as a catalyst, after which the reaction mixture is allowed to react with stirring at room temperature for 1 to 24 hours. After the completion of the reaction, the organic solvent is removed, whereby the desired polymer [A] can be obtained.
(2) Method of Using Monomer as Precursor Compound In this method, an adduct is obtained by allowing the compound (1) to react with the hydroxyl group or the carboxyl group of a monomer having a hydroxyl group or a carboxyl group, and the thus obtained adduct is subsequently polymerized to obtain the polymer W. For such a method of obtaining the polymer [A], reference can be made to a known method. For example, as described in JP 2005-187609A, an adduct is formed by generating an acetal bond from the hydroxyl group of the monomer having a hydroxyl group with the vinyl ether group of the compound (1) or by generating a hemiacetal ester bond from the carboxyl group of the monomer having a carboxyl group with the vinyl ether group of the compound (1). Then, using the thus obtained adduct, the polymer [A] can be obtained in the same manner as the above-described method of producing a polymer having a hydroxyl group or a carboxyl group.

Preferred examples of the polymer [A] obtained in the above-described manner include polymers having at least one selected from the group consisting of structural units represented by the following Formulae (2) to (5):

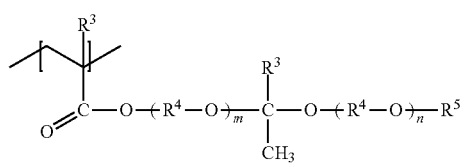

(2)

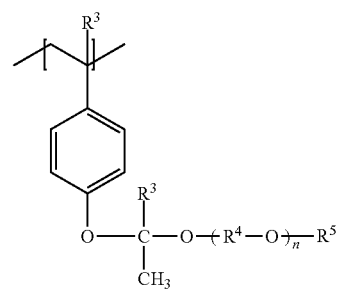

(3)

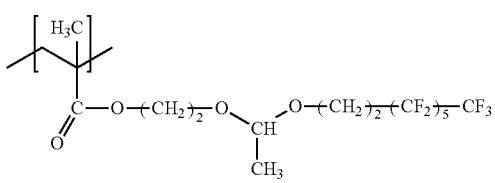

(4)

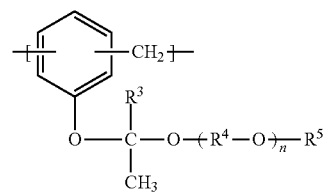

(5)

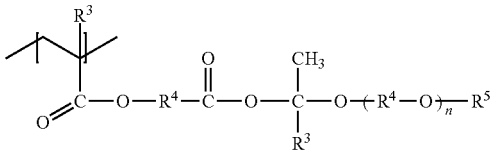

(wherein, $R^3$ independently represents a hydrogen atom or a methyl group; $R^4$ independently represents a methylene group, a C2-12 alkylene group, a C2-12 alkenylene group, a group in which the alkylene group or the alkenylene group is partially substituted with —O—, —(C=O)O— or —O(C=O)—, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom; $R^5$ independently represents a group in which at least one hydrogen atom of a hydrocarbon group is substituted with a fluorine atom; m represents 0 or 1; and n independently represents an integer of 0 to 12).

Examples of the $R^4$ include the same groups as those exemplified above for the $R^A$.

Examples of the $R^5$ include the same groups as those exemplified above for the $R^B$.

The n is preferably an integer of 0 to 9.

More preferred examples of the polymer [A] include polymers having at least one selected from the group consisting of structural units represented by the following formulae, as well as those structural units represented by the following formulae whose side chain terminal is a group represented by any one of the Formulae (1-1) to (1-33), a 2,2,2-trifluoroethyl group or a 1,2,2-trifluorovinyl group.

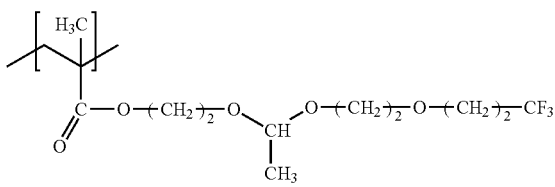

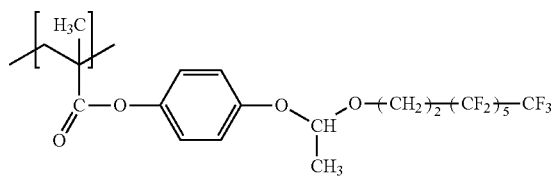

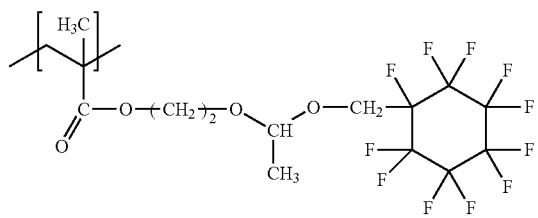

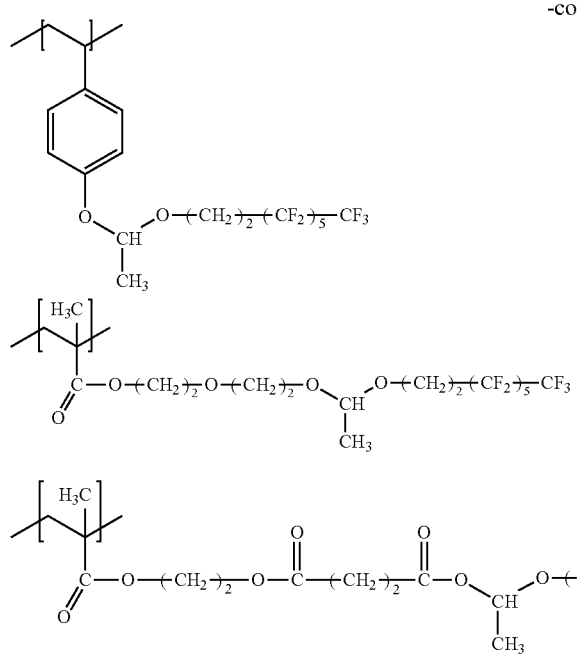
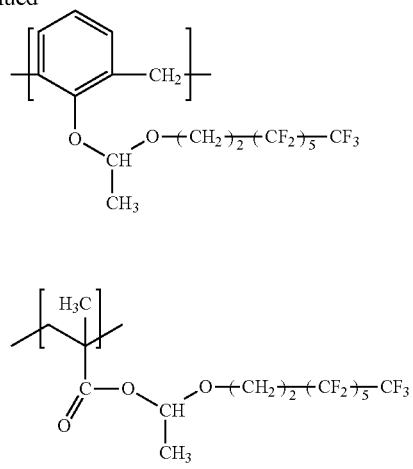

The polymer [A] may be used individually, or two or more thereof may be used.

<Solvent [B]>

The solvent [B] is not particularly restricted; however, it is preferably a solvent which is capable of uniformly dissolving or dispersing the polymer [A] and other components, such as the below-described acid generator [C] and polymerizable compound [F].

Examples of preferred solvent [B] include alcoholic solvents, ethers, diethylene glycol alkyl ethers, ethylene glycol alkyl ether acetates, propylene glycol monoalkyl ether acetates, propylene glycol monoalkyl ether propionates, aliphatic hydrocarbons, aromatic hydrocarbons, ketones, and esters.

Examples of the alcoholic solvents include long-chain alkyl alcohols such as 1-hexanol, 1-octanol, 1-nonanol, 1-dodecanol, 1,6-hexanediol and 1,8-octanediol;

aromatic alcohols such as benzyl alcohol;

ethylene glycol monoalkyl ethers such as ethylene glycol monomethyl ether, ethylene glycol monoethyl ether, ethylene glycol monopropyl ether and ethylene glycol monobutyl ether;

propylene glycol monoalkyl ethers such as propylene glycol monomethyl ether, propylene glycol monoethyl ether, propylene glycol monopropyl ether and propylene glycol monobutyl ether; and dipropylene glycol monoalkyl ethers such as dipropylene glycol monomethyl ether, dipropylene glycol monoethyl ether, dipropylene glycol monopropyl ether and dipropylene glycol monobutyl ether.

These alcoholic solvents may be used individually, or two or more thereof may be used.

Among these alcoholic solvents, particularly from the standpoint of improving the coating properties, benzyl alcohol, ethylene glycol monopropyl ether, ethylene glycol monobutyl ether, propylene glycol monomethyl ether and propylene glycol monoethyl ether are preferred.

Examples of the ethers include tetrahydrofuran, hexyl methyl ether, triethylene glycol dimethyl ether, triethylene glycol diethyl ether, and 1,4-dioxane.

Examples of the diethylene glycol alkyl ethers include diethylene glycol dimethyl ether, diethylene glycol diethyl ether, and diethylene glycol ethylmethyl ether.

Examples of the ethylene glycol alkyl ether acetates include methylcellosolve acetate, ethylcellosolve acetate, and ethylene glycol monobutyl ether acetate.

Examples of the propylene glycol monoalkyl ether acetates include propylene glycol monomethyl ether acetate, propylene glycol monoethyl ether acetate, propylene glycol monopropyl ether acetate, and propylene glycol monobutyl ether acetate.

Examples of the propylene glycol monoalkyl ether propionates include propylene glycol monomethyl ether propionate, propylene glycol monoethyl ether propionate, propylene glycol monopropyl ether propionate, and propylene glycol monobutyl ether propionate.

Examples of the aliphatic hydrocarbons include n-pentane, n-hexane, n-heptane, n-octane, n-nonane, n-decane, n-undecane, n-dodecane, cyclohexane, and decalin.

Examples of the aromatic hydrocarbons include benzene, toluene, xylene, ethylbenzene, n-propylbenzene, i-propylbenzene, n-butylbenzene, mesitylene, chlorobenzene, and dichlorobenzene.

Examples of the ketones include methyl ethyl ketone, methyl isobutyl ketone, cyclohexanone, 2-heptanone, and 4-hydroxy-4-methyl-2-heptanone.

Examples of the esters include methyl acetate, ethyl acetate, propyl acetate, i-propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propylethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, and ethyl 2-ethoxypropionate.

The above-exemplified solvents [B] may be used individually, or two or more thereof may be used.

The solvent is used in an amount of preferably 200 to 1,600 parts by mass, more preferably 400 to 1,000 parts by mass, with respect to 100 parts by mass of the components of the resin composition excluding the solvent. By controlling the amount of the solvent in this range, the coating properties of the resin composition are improved and the occurrence of uneven coating (e.g., striped unevenness, pin-mark unevenness, hazy unevenness) is inhibited, so that a coating film having an improved thickness uniformity can be obtained.

<Acid Generator [C]>

The acid generator [C] is a compound which generates an acid at least when irradiated with radiation. By incorporating the acid generator [C] into the resin composition, the acid-dissociable group is allowed to dissociate from the polymer [A].

Examples of the acid generator [C] include oximesulfonate compounds, onium salts, sulfonimide compounds, halogen-containing compounds, diazomethane compounds, sulfone compounds, sulfonic acid ester compounds, and carboxylic acid ester compounds.

These acid generators [C] may be used individually, or two or more thereof may be used.

[Oximesulfonate Compound]

As the oximesulfonate compounds, compounds containing an oximesulfonate group represented by the following Formula (5) are preferred.

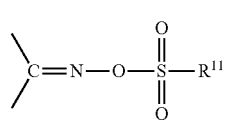

(5)

In the Formula (5), $R^{11}$ is a C1-12 alkyl group, a C1-12 fluoroalkyl group, a C4-12 alicyclic hydrocarbon group, a C6-20 aryl group, or a group in which some or all of the hydrogen atoms of the alkyl group, alicyclic hydrocarbon group or aryl group are substituted with a substituent(s).

The alkyl group represented by $R^{11}$ is preferably a C1-12 linear or branched alkyl group. This C1-12 linear or branched alkyl group may be substituted with a substituent, and examples of the substituent include C1-10 alkoxy groups, and alicyclic groups containing a bridged alicyclic group, such as a 7,7-dimethyl-2-oxonorbornyl group. Examples of the C1-12 fluoroalkyl group include a trifluoromethyl group, a pentafluoroethyl group, and a heptylfluoropropyl group.

The C4-12 alicyclic hydrocarbon group represented by $R^{11}$ may be substituted with a substituent, and examples of the substituent include C1-5 alkyl groups, alkoxy groups, and halogen atoms.

The C6-20 aryl group represented by $R^{11}$ is preferably a phenyl group, a naphthyl group, a tolyl group or a xylyl group. The aryl group may be substituted with a substituent, and examples of the substituent include C1-5 alkyl groups, alkoxy groups, and halogen atoms.

Examples of the compounds containing an oximesulfonate group represented by the Formula (5) include oximesulfonate compounds represented by the following Formulae (5-1), (5-2) and (5-3).

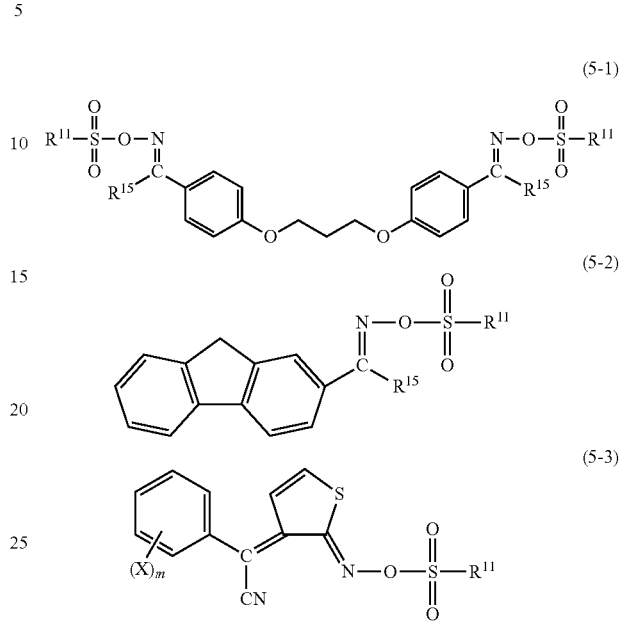

In the Formulae (5-1), (5-2) and (5-3), $R^{11}$ has the same meaning as in the above-described Formula (5). In the Formulae (5-1), (5-2) and (5-3), $R^{15}$ is a C1-12 alkyl group or a C1-12 fluoroalkyl group.

In the Formula (5-3), X is an alkyl group, an alkoxy group or a halogen atom and m is an integer of 0 to 3, with a proviso that, when there are plural Xs, the plural Xs may be the same or different from one another.

In the Formula (5-3), the alkyl group represented by X is preferably a C1-4 linear or branched alkyl group; the alkoxy group represented by X is preferably a C1-4 linear or branched alkoxy group; the halogen atom represented by X is preferably a chlorine atom or a fluorine atom; and m is preferably 0 or 1. In the Formula (5-3), a compound in which m is 1, X is a methyl group and the substitution position of X is ortho-position is particularly preferred.

Examples of the oxime sulfonate compounds represented by the Formula (5-3) include compounds represented by the following Formulae (5-3-1) to (5-3-5).

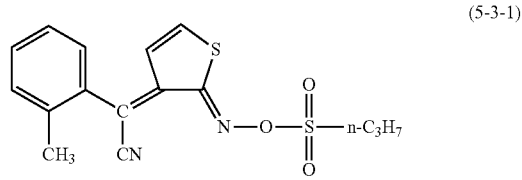

(5-3-1)

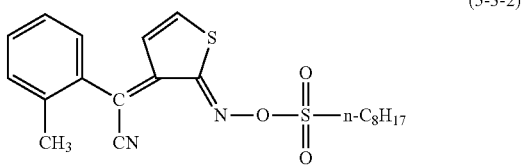

(5-3-2)

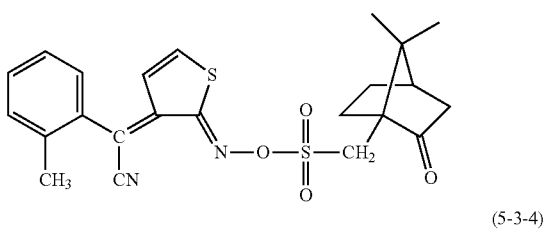

(5-3-3)

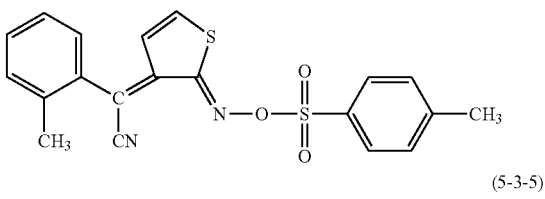

(5-3-4)

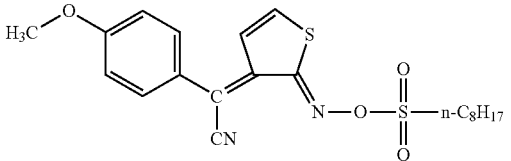

(5-3-5)

The compounds represented by the Formulae (5-3-1) to (5-3-5) are
(5-propylsulfonyloxyimino-5H-thiophene-2-ylidene)-(2-methylphenyl)acetonitrile,
(5-octylsulfonyloxyimino-5H-thiophene-2-ylidene)-(2-methylphenyl)acetonitrile,
(camphorsulfonyloxyimino-5H-thiophene-2-ylidene)-(2-methylphenyl)acetonitrile,
(5-p-toluenesulfonyloxyimino-5H-thiophene-2-ylidene)-(2-methylphenyl)acetonitrile, and
(5-octylsulfonyloxyimino)-(4-methoxyphenyl)acetonitrile, respectively, which are commercially available.

[Onium Salt]

Examples of the onium salts include diphenyliodonium salts, triphenylsulfonium salts, alkylsulfonium salts, benzylsulfonium salts, dibenzylsulfonium salts, substituted benzylsulfonium salts, benzothiazonium salts, and tetrahydrothiophenium salts.

Examples of the diphenyliodonium salts include diphenyliodonium tetrafluoroborate, diphenyliodonium hexafluorophosphonate, diphenyliodonium hexafluoroarsenate, diphenyliodonium trifluoromethanesulfonate, diphenyliodonium trifluoroacetate, diphenyliodonium-p-toluenesulfonate, diphenyliodonium butyltris(2,6-difluorophenyl)borate, 4-methoxyphenylphenyliodonium tetrafluoroborate, bis(4-t-butylphenyl)iodonium tetrafluoroborate, bis(4-t-butylphenyl)iodonium hexafluoroarsenate, bis(4-t-butylphenyl)iodonium trifluoromethanesulfonate, bis(4-t-butylphenyl)iodonium trifluoroacetate, bis(4-t-butylphenyl)iodonium-p-toluenesulfonate, and bis(4-t-butylphenyl)iodonium camphorsulfonic acid.

Examples of the triphenylsulfonium salts include triphenylsulfonium trifluoromethane sulfonate, triphenylsulfonium camphorsulfonic acid, triphenylsulfonium tetrafluoroborate, triphenylsulfonium trifluoroacetate, triphenylsulfonium-p-toluenesulfonate, and triphenylsulfonium butyltris(2,6-difluorophenyl)borate.

Examples of the alkylsulfonium salts include 4-acetoxyphenyldimethylsulfonium hexafluoroantimonate, 4-acetoxyphenyldimethylsulfonium hexafluoroarsenate, dimethyl-4-(benzyloxycarbonyloxy)phenylsulfonium hexafluoroantimonate, dimethyl-4-(benzoyloxy)phenylsulfonium hexafluoroantimonate, dimethyl-4-(benzoyloxy)phenylsulfonium hexafluoroarsenate, and dimethyl-3-chloro-4-acetoxyphenylsulfonium hexafluoroantimonate.

Examples of the benzylsulfonium salts include benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluoroarsenate, and 4-methoxybenzyl-4-hydroxyphenylmethylsulfonium hexafluorophosphate.

Examples of the dibenzylsulfonium salts include dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-t-butylphenylsulfonium hexafluoroantimonate, and benzyl-4-methoxybenzyl-4-hydroxyphenylsulfonium hexafluorophosphate.

Examples of the substituted benzylsulfonium salts include
p-chlorobenzyl-4-hydroxyphenylmethylsulfonium hexafluoroantimonate,
p-nitrobenzyl-4-hydroxyphenylmethylsulfonium hexafluoroantimonate,
p-chlorobenzyl-4-hydroxyphenylmethylsulfonium hexafluorophosphate,
p-nitrobenzyl-3-methyl-4-hydroxyphenylmethylsulfonium hexafluoroantimonate,
3,5-dichlorobenzyl-4-hydroxyphenylmethylsulfonium hexafluoroantimonate, and
o-chlorobenzyl-3-chloro-4-hydroxyphenylmethylsulfonium hexafluoroantimonate.

Examples of the benzothiazonium salts include 3-benzyl benzothiazonium hexafluoroantimonate, 3-benzylbenzothiazonium hexafluorophosphate, 3-benzylbenzothiazoniumtetrafluoroborate, 3-(p-methoxybenzyl)benzothiazonium hexafluoroantimonate, 3-benzyl-2-methylthiobenzothiazonium hexafluoroantimonate, and 3-benzyl-5-chlorobenzothiazonium hexafluoroantimonate.

Examples of the tetrahydrothiophenium salts include
4,7-di-n-butoxy-1-naphthyltetrahydrothiophenium trifluoromethanesulfonate,
1-(4-n-butoxynaphthalene-1-yl)tetrahydrothiophenium trifluoromethanesulfonate,
1-(4-n-butoxynaphthalene-1-yl)tetrahydrothiophenium nonafluoro-n-butanesulfonate,
1-(4-n-butoxynaphthalene-1-yl)tetrahydrothiophenium-1,1,2,2-tetrafluoro-2-(norbornane-2-yl)ethanesulfonate,
1-(4-n-butoxynaphthalene-1-yl)tetrahydrothiophenium-2-(5-t-butoxycarbonyloxybicyclo[2.2.1]heptane-2-yl)-1,1,2,2-tetrafluoroethanesulfonate, and
1-(4-n-butoxynaphthalene-1-yl)tetrahydrothiophenium-2-(6-t-butoxycarbonyloxybicyclo[2.2.1]heptane-2-yl)-1,1,2,2-tetrafluoroethanesulfonate.

[Sulfonimide Compound]

Examples of sulfonimide compounds preferred as the acid generator [C] include N-(trifluoromethylsulfonyloxy) succinimide,
N-(camphorsulfonyloxy)succinimide,
N-(4-methylphenylsulfonyloxy)succinimide,
N-(2-trifluoromethylphenylsulfonyloxy)succinimide, N-(4-fluorophenylsulfonyloxy)succinimide,
N-(trifluoromethylsulfonyloxy)phthalimide,
N-(camphorsulfonyloxy)phthalimide,
N-(2-trifluoromethylphenylsulfonyloxy)phthalimide,
N-(2-fluorophenylsulfonyloxy)phthalimide,
N-(trifluoromethylsulfonyloxy)diphenylmaleimide,
N-(camphorsulfonyloxy)diphenylmaleimide,
4-methylphenylsulfonyloxy)diphenylmaleimide,
N-(2-trifluoromethylphenylsulfonyloxy)diphenylmaleimide,
N-(4-fluorophenylsulfonyloxy)diphenylmaleimide,
N-(4-fluorophenylsulfonyloxy)diphenylmaleimide,
N-(phenylsulfonyloxy)bicyclo[2.2.1]hepto-5-ene-2,3-dicarboxyimide,
N-(4-methylphenylsulfonyloxy)bicyclo[2.2.1]hepto-5-ene-2,3-dicarboxyimide,
N-(trifluoromethanesulfonyloxy)bicyclo[2.2.1]hepto-5-ene-2,3-dicarboxyimide,
N-(nonafluorobutanesulfonyloxy)bicyclo[2.2.1]hepto-5-ene-2,3-dicarboxyimide,
N-(camphorsulfonyloxy)bicyclo[2.2.1]hepto-5-ene-2,3-dicarboxy imide,
N-(camphorsulfonyloxy)-7-oxabicyclo[2.2.1]hepto-5-ene-2,3-dicarboxyimide,
N-(trifluoromethylsulfonyloxy)-7-oxabicyclo[2.2.1]hepto-5-ene-2,3-dicarboxyimide,
N-(4-methylphenylsulfonyloxy)bicyclo[2.2.1]hepto-5-ene-2,3-dicarboxyimide,
N-(4-methylphenylsulfonyloxy)-7-oxabicyclo[2.2.1]hepto-5-ene-2,3-dicarboxyimide,
N-(2-trifluoromethylphenylsulfonyloxy)bicyclo[2.2.1]hepto-5-ene-2,3-dicarboxyimide,
N-(2-trifluoromethylphenylsulfonyloxy)-7-oxabicyclo[2.2.1]hepto-5-ene-2,3-dicarboxyimide,
N-(4-fluorophenylsulfonyloxy)bicyclo[2.2.1]hepto-5-ene-2,3-dicarboxyimide,
N-(4-fluorophenylsulfonyloxy)-7-oxabicyclo[2.2.1]hepto-5-ene-2,3-dicarboxyimide,
N-(trifluoromethylsulfonyloxy)bicyclo[2.2.1]heptane-5,6-oxy-2,3-dicarboxyimide,
N-(camphorsulfonyloxy)bicyclo[2.2.1]heptane-5,6-oxy-2,3-dicarboxyimide,
N-(4-methylphenylsulfonyloxy)bicyclo[2.2.1]heptane-5,6-oxy-2, 3-dicarboxyimide,
N-(2-trifluoromethylphenylsulfonyloxy)bicyclo[2.2.1]heptane-5,6-oxy-2,3-dicarboxyimide,
N-(4-fluorophenylsulfonyloxy)bicyclo[2.2.1]heptane-5,6-oxy-2, 3-dicarboxyimide, N-(trifluoromethylsulfonyloxy)naphthyl dicarboxyimide, N-(camphorsulfonyloxy)naphthyldicarboxyimide,
N-(4-methylphenylsulfonyloxy)naphthyl dicarboxyimide,
N-(phenylsulfonyloxy)naphthyl dicarboxyimide,
N-(2-trifluoromethylphenylsulfonyloxy)naphthyl dicarboxyimide,
N-(4-fluorophenylsulfonyloxy)naphthyl dicarboxyimide,
N-(pentafluoroethylsulfonyloxy)naphthyl dicarboxyimide,
N-(heptafluoropropylsulfonyloxy)naphthyl dicarboxyimide,
N-(nonafluorobutylsulfonyloxy)naphthyl dicarboxyimide,
N-(ethylsulfonyloxy)naphthyl dicarboxyimide,
N-(propylsulfonyloxy)naphthyl dicarboxyimide,
N-(butylsulfonyloxy)naphthyl dicarboxyimide,
N-(pentylsulfonyloxy)naphthyl dicarboxyimide,
N-(hexylsulfonyloxy)naphthyl dicarboxyimide,
N-(heptylsulfonyloxy)naphthyl dicarboxyimide,
N-(octylsulfonyloxy)naphthyl dicarboxyimide, and
N-(nonylsulfonyloxy)naphthyl dicarboxyimide.
[Halogen-containing Compound]

Examples of halogen-containing compounds preferred as the acid generator [C] include haloalkyl group-containing hydrocarbon compounds and haloalkyl group-containing heterocyclic compounds.

[Diazomethane Compound]

Examples of diazomethane compounds preferred as the acid generator [C] include bis(trifluoromethylsulfonyl)diazomethane,
bis(cyclohexylsulfonyl)diazomethane,
bis(phenylsulfonyl)diazomethane,
bis(p-tolylsulfonyl)diazomethane,
bis(2,4-xylylsulfonyl)diazomethane,
bis(p-chlorophenylsulfonyl)diazomethane,
methylsulfonyl-p-toluenesulfonyl diazomethane,
cyclohexylsulfonyl(1,1-dimethylethylsulfonyl)diazomethane,
bis(1,1-dimethylethylsulfonyl)diazomethane, and
phenylsulfonyl(benzoyl)diazomethane.

[Sulfone Compound]

Examples of sulfone compounds preferred as the acid generator [C] include β-ketosulfone compounds, β-sulfonylsulfone compounds, and diaryldisulfone compounds.

[Sulfonic Acid Ester Compound]

Examples of sulfonic acid ester compounds preferred as the acid generator [C] include alkyl sulfonates, haloalkyl sulfonates, aryl sulfonates, and iminosulfonates.

[Carboxylic Acid Ester Compound]

Examples of carboxylic acid ester compounds preferred as the acid generator [C] include o-nitrobenzyl carboxylates.

As the acid generator [C], oxime sulfonate compounds, onium salts and sulfonic acid ester compounds are preferred, and oxime sulfonate compounds are more preferred. As the oxime sulfonate compounds, compounds containing an oxime sulfonate group which are represented by the Formulae (5-3-1) to (5-3-5) are preferred, and compounds represented by the Formula (5-3-5) are more preferred.

Further, as the onium salts, tetrahydrothiophenium salts and benzylsulfonium salts are preferred, 4,7-di-n-butoxy-1-naphthyltetrahydrothiophenium trifluoromethanesulfonate and benzyl-4-hydroxyphenylmethylsulfonium hexafluorophosphate are more preferred, and 4,7-di-n-butoxy-1-naphthyltetrahydrothiophenium trifluoromethanesulfonate is still more preferred. As the sulfonic acid ester compounds, haloalkyl sulfonate are preferred, and N-hydroxynaphthalimide-trifluoromethane sulfonate is more preferred. By using any of the above-described compounds as the acid generator [C], the sensitivity of the resin composition can be enhanced and the solubility can be further improved.

The content of the acid generator [C] is preferably 0.1 to 10 parts by mass, more preferably 1 to 5 parts by mass, with respect to 100 parts by mass of the polymer [A]. By controlling the content of the acid generator [C] in this range, the sensitivity of the resin composition can be optimized, so that a high-resolution recessed pattern can be formed through the steps (i) and (ii).

<Sensitizer [D]>

The resin composition may contain a sensitizer [D].

By incorporating the sensitizer [D] into the resin composition, the radiation sensitivity of the composition can be further improved. The sensitizer [D] is preferably a compound which absorbs active rays or radiation and thereby electronically excited. When the electronically excited sensitizer [D] comes into contact with the acid generator [C], for example, electron transfer, energy transfer or heat generation takes place, as a result of which the acid generator [C] undergoes a chemical change and is thereby decomposed to generate an acid.

Examples of the sensitizer [D] include compounds that belong to the below-described compounds and have an absorption wavelength in a region of 350 nm to 450 nm.

Examples of the sensitizer [D] include polynuclear aromatic compounds such as pyrene, perylene, triphenylene, anthracene, 9,10-dibutoxyanthracene, 9,10-diethoxyanthracene, 3,7-dimethoxyanthracene and 9,10-dipropyloxyanthracene;

xanthenes such as fluorescein, eosin, erythrosine, Rhodamine B and Rose Bengal;

xanthones such as xanthone, thioxanthone, dimethylthioxanthone, diethylthioxanthone, isopropylthioxanthone and 2,4-diethylthioxanthen-9-one;

cyanines such as thiacarbocyanine and oxacarbocyanine;

merocyanines such as merocyanine and carbomerocyanine;

rhodacyanines;

oxonols;

thiazines such as thionine, methylene blue and toluidine blue;

acridines such as acridine orange, chloroflavin and acriflavin;

acridones such as acridone and 10-butyl-2-chloroacridone;

anthraquinones such as anthraquinone;

squaryliums such as squarylium;

styryls;

base styryls such as 2-[2-[4-(dimethylamino)phenyl]ethenyl]benzoxazole; and coumarins such as 7-diethylamino-4-methylcoumarin, 7-hydroxy-4-methylcoumarin and 2,3,6,7-tetrahydro-9-methyl-1H,5H,11H[1]benzopyrano[6,7,8-ij] quinolizin-11-one.

Among these sensitizers [D], polynuclear aromatic compounds, acridones, styryls, base styryls, coumarins and xanthones are preferred, and xanthones are more preferred. Among xanthones, diethylthioxanthone, 2,4-diethylthioxanthen-9-one and isopropylthioxanthone are particularly preferred.

The sensitizer [D] may be used individually, or two or more thereof may be used. When the sensitizer [D] is used, the amount thereof is preferably 0.05 to 8 parts by mass, more preferably 0.1 to 4 parts by mass, with respect to 100 parts by mass of the polymer W. By controlling the amount of the sensitizer [D] in this range, the sensitivity of the resin composition can be optimized, so that a high-resolution recessed pattern can be formed through the steps (i) and (ii).

<Quencher [E]>

The resin composition may contain a quencher [E].

The quencher [E] functions as an acid diffusion-inhibiting agent which inhibits diffusion of an acid from the acid generator [C]. Examples of the quencher [E] include alkylamines and cyclic amines such as imidazoles, specifically compounds having an imidazole structure (e.g., 2-phenylbenzimidazole and 2,4,5-triphenylimidazole), compounds having a piperidine structure [e.g., N-hydroxyethyl piperidine and bis(1,2,2,6,6-pentamethyl-4-piperidyl)sebacate], compounds having a pyridine structure (e.g., 4-dimethylaminopyridine), compounds having an antipyrine structure (e.g., antipyrine and hydroxyantipyrine), 1,5-diazabicyclo[4.3.0]nona-5-ene, and 1,8-diazabicyclo[5.4.0]-undec-7-ene.

Examples of the quencher [E] also include photodegradable bases that generate a weak acid upon exposure to light. A photodegradable bas generates an acid in an exposed part; however, in an unexposed part, it exhibits a high acid-capturing function based on an anion to capture the acid generated from the acid generator [C] and thereby deactivates the acid diffusing from the exposed part to the unexposed part. That is, since the acid is deactivated only in the unexposed part, the contrast of the dissociation reaction of the protecting group is improved, as a result of which the resolution can be further improved. Examples of such a photodegradable base include onium salt compounds that are decomposed upon exposure to light and lose the acid diffusion-controlling property.

The quencher [E] may be used individually, or two or more thereof may be used.

The content of the quencher [E] is preferably 0.001 to 5 parts by mass, more preferably 0.005 to 3 parts by mass, with respect to 100 parts by mass of the polymer [A]. By controlling the content of the sensitizer [D] in this range, the reactivity of the resin composition can be optimized, so that a high-resolution recessed pattern can be formed through the steps (i) and (ii).

<Polymerizable Compound [F]>

The resin composition is made curable by incorporating a polymerizable compound [F] therein.

The polymerizable compound [F] is preferably a polymerizable compound having an ethylenically unsaturated bond. However, it is a compound different from the polymer [A].

From the standpoints of attaining good polymerizability and improving the strength of the film obtained from the resin composition, the polymerizable compound [F] is preferably a monofunctional, bifunctional or tri- or higher functional (meth)acrylic acid ester.

The term "monofunctional compound" refers to a compound having one (meth)acryloyl group, and the terms "bifunctional compound" and "tri- or higher functional compound" refer to a compound having two (meth)acryloyl groups and a compound having three or more (meth)acryloyl groups, respectively.

Examples of the monofunctional (meth)acrylic acid ester include 2-hydroxyethyl acrylate, 2-hydroxyethyl methacrylate, diethylene glycol monoethyl ether acrylate, diethylene glycol monoethyl ether methacrylate, (2-acryloyloxyethyl) (2-hydroxypropyl)phthalate, (2-methacryloyloxyethyl)(2-hydroxypropyl)phthalate, and ω-carboxypolycaprolactone monoacrylate. Examples of commercial products thereof include ARONIX (registered trademark) M-101, ARONIX M-111, ARONIX M-114 and ARONIX M-5300 (all of which are manufactured by Toagosei Co., Ltd.); KAYARAD (registered trademark) TC-110S and KAYARAD TC-120S (both of which are manufactured by Nippon Kayaku Co., Ltd.); VISCOAT 158 and VISCOAT 2311 (both of which are manufactured by Osaka Organic Chemical Industry Ltd.).

Examples of the bifunctional (meth)acrylic acid ester include ethylene glycol diacrylate, propylene glycol diacrylate, propylene glycol dimethacrylate, ethylene glycol dimethacrylate, diethylene glycol diacrylate, diethylene glycol dimethacrylate, tetraethylene glycol diacrylate, tetraethylene glycol dimethacrylate, 1,6-hexanediol diacrylate, 1,6-hexanediol dimethacrylate, 1,9-nonanediol diacrylate, and 1,9-nonanediol dimethacrylate. Examples of commercial products thereof include ARONIX (registered trademark) M-210, ARONIX M-240 and ARONIX M-6200 (all of which are manufactured by Toagosei Co., Ltd.); KAYARAD (registered trademark) HDDA, KAYARAD HX-220 and KAYARAD R-604 (all of which are manufactured by Nippon Kayaku Co., Ltd.); VISCOAT 260, VISCOAT 312 and VISCOAT 335HP (all of which are manufactured by Osaka Organic Chemical Industry Ltd.); and LIGHT ACRYLATE 1,9-NDA (manufactured by Kyoeisha Chemical Co., Ltd.).

Examples of the tri- or higher functional (meth)acrylic acid ester include trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, a mixture of dipentaerythritol pentaacrylate and dipentaerythritol hexaacrylate, dipentaerythritol hexamethacrylate, ethylene oxide-modified dipentaerythritol hexaacrylate, tri(2-acryloyloxyethyl) phosphate, tri(2-methacryloyloxyethyl)phosphate, succinic acid-modified pentaerythritol triacrylate, succinic acid-modified dipentaerythritol pentaacrylate, tris(acryloxyethyl) isocyanurate, and polyfunctional urethane acrylate compounds obtained by a reaction between a compound having a linear alkylene group and an alicyclic structure along with two or more isocyanate groups and a compound having one or more hydroxyl groups in the molecule along with three, four or five (meth)acryloyloxy groups. Examples of commercial products thereof include ARONIX (registered trademark) M-309, ARONIX M-315, ARONIX M-400, ARONIX M-405, ARONIX M-450, ARONIX M-7100, ARONIX M-8030, ARONIX M-8060 and ARONIX TO-1450 (all of which are manufactured by Toagosei Co., Ltd.); KAYARAD (registered trademark) TMPTA, KAYARAD DPHA, KAYARAD DPCA-20, KAYARAD DPCA-30, KAYARAD DPCA-60, KAYARAD DPCA-120 and KAYARAD DPEA-12 (all of which are manufactured by Nippon Kayaku Co., Ltd.); and VISCOAT 295, VISCOAT 300, VISCOAT 360, VISCOAT GPT, VISCOAT 3PA and VISCOAT 400 (all of which are manufactured by Osaka Organic Chemical Industry Ltd.). Examples of commercial products containing a polyfunctional urethane acrylate compound include NEW FRONTIER (registered trademark) R-1150 (manufactured by Dai-ichi Kogyo Seiyaku Co., Ltd.) and KAYARAD (registered trademark) DPHA-40H (manufactured by Nippon Kayaku Co., Ltd.).

Among these polymerizable compounds [F], for example, ω-carboxypolycaprolactone monoacrylate, 1,9-nonanediol dimethacrylate, trimethylolpropane triacrylate, pentaerythritol triacrylate, pentaerythritol tetraacrylate, dipentaerythritol pentaacrylate, dipentaerythritol hexaacrylate, a mixture of dipentaerythritol hexaacrylate and dipentaerythritol pentaacrylate, ethylene oxide-modified dipentaerythritol hexaacrylate, succinic acid-modified pentaerythritol triacrylate, succinic acid-modified dipentaerythritol pentaacrylate, and commercially available products containing a polyfunctional urethane acrylate compound are preferred. Thereamong, tri- or higher functional (meth)acrylic acid esters are preferred, and a mixture of dipentaerythritol hexaacrylate and dipentaerythritol pentaacrylate is particularly preferred.

The polymerizable compound [F] may be used individually, or two or more thereof may be used. The polymerizable compound [F] is used in an amount of preferably 1 to 300 parts by mass, more preferably 3 to 200 parts by mass, still more preferably 4 to 100 parts by mass, with respect to 100 parts by mass of the polymer W. By controlling the amount of the polymerizable compound [F] in this range, the hardness of the coating film obtained from the resin composition can be improved and superior heat resistance can be attained.

<Radiation-sensitive Polymerization Initiator [G]>

The radiation-sensitive polymerization initiator [G] is a compound which promotes polymerization of the polymerizable compound [F] upon irradiation with radiation. Thus, when the resin composition contains the polymerizable compound [F], it is preferred to use the radiation-sensitive polymerization initiator [G].

Examples of the radiation-sensitive polymerization initiator [G] include O-acyloxime compounds, acetophenone compounds, and biimidazole compounds.

Specific examples of the O-acyloxime compounds include
ethanone-1-[9-ethyl-6-(2-methylbenzoyl)-9H-carbazol-3-yl]-1-(O-acetyloxime),
1-[9-ethyl-6-benzoyl-9.H.-carbazol-3-yl]-octan-1-one oxime-O-acetate,
1-[9-ethyl-6-(2-methylbenzoyl)-9.H.-carbazol-3-yl]-ethan-1-one oxime-O-benzoate,
1-[9-n-butyl-6-(2-ethyl-benzoyl)-9.H.-carbazol-3-yl]-ethan-1-one oxime-O-benzoate,
ethanone-1-[9-ethyl-6-(2-methyl-4-tetrahydrofuranylbenzoyl)-9.H.-carbazol-3-yl]-1-(O-acetyloxime),
ethanone-1-[9-ethyl-6-(2-methyl-4-tetrahydropyranylbenzoyl)-9.H.-carbazol-3-yl]-1-(O-acetyloxime),
ethanone-1-[9-ethyl-6-(2-methyl-5-tetrahydrofuranylbenzoyl)-9.H.-carbazol-3-yl]-1-(O-acetyloxime),
ethanone-1-[9-ethyl-6-{2-methyl-4-(2,2-dimethyl-1,3-dioxolanyl)methoxybenzoyl}-9.H.-carbazol-3-yl]-1-(O-acetyloxime), and
ethanone-1-[9-ethyl-6-(2-methyl-4-tetrahydrofuranylmethoxybenzoyl)-9.H.-carbazol-3-yl]-1-(O-acetyloxime). These O-acyloxime compounds may be used individually, or two or more thereof may be used.

Thereamong, examples of preferred O-acyloxime compounds include
ethanone-1-[9-ethyl-6-(2-methylbenzoyl)-9H-carbazol-3-yl]-1-(O-acetyloxime),
ethanone-1-[9-ethyl-6-(2-methyl-4-tetrahydrofuranylmethoxybenzoyl)-9.H.-carbazol-3-yl]-1-(O-acetyloxime), and
ethanone-1-[9-ethyl-6-{2-methyl-4-(2,2-dimethyl-1,3-dioxolanyl)methoxybenzoyl}-9.H.-carbazol-3-yl]-1-(O-acetyloxime).

Examples of the acetophenone compounds include α-aminoketone compounds and α-hydroxyketone compounds.

Specific examples of the α-aminoketone compounds include 2-benzyl-2-dimethylamino-1-(4-morpholinophenyl)-butan-1-one, 2-dimethylamino-2-(4-methylbenzyl)-1-(4-morpholin-4-yl-phenyl-butan-1-one, and 2-methyl-1-(4-methylthiophenyl)-2-morpholinopropan-1-one.

Specific examples of the α-hydroxyketone compounds include
1-phenyl-2-hydroxy-2-methylpropan-1-one,
1-(4-i-propylphenyl)-2-hydroxy-2-methylpropan-1-one,
4-(2-hydroxyethoxy)phenyl-(2-hydroxy-2-propyl) ketone, and
1-hydroxycyclohexylphenyl ketone.

The above-described acetophenone compounds may be used individually, or two or more thereof may be used.

Among these acetophenone compounds, α-aminoketone compounds are preferred, and
2-dimethylamino-2-(4-methylbenzyl)-1-(4-morpholin-4-yl-phenyl-butan-1-one and
2-methyl-1-(4-methylthiophenyl)-2-morpholinopropan-1-one are particularly preferred.

Specific examples of the biimidazole compounds include 2,2'-bis(2-chlorophenyl)-4,4',5,5'-tetrakis(4-ethoxycarbonylphenyl)-1,2'-biimidazole, 2,2'-bis(2-chlorophenyl)-4,4', 5,5'-tetraphenyl-1,2'-biimidazole, 2,2'-bis(2,4-dichlorophenyl)-4,4',5,5'-tetraphenyl-1,2'-biimidazole, and 2,2'-bis(2,4, 6-trichlorophenyl)-4,4',5,5'-tetraphenyl-1,2'-biimidazole. These biimidazole compounds may be used individually, or two or more thereof may be used.

Among these biimidazole compounds,
2,2'-bis(2-chlorophenyl)-4,4',5,5'-tetraphenyl-1,2'-biimidazole,
2,2'-bis(2,4-dichlorophenyl)-4,4',5,5'-tetraphenyl-1,2'-biimidazole and
2,2'-bis(2,4,6-trichlorophenyl)-4,4',5,5'-tetraphenyl-1,2'-biimidazole are preferred, and
2,2'-bis(2,4-dichlorophenyl)-4,4',5,5'-tetraphenyl-1,2'-biimidazole is particularly preferred.

In the resin composition, when a biimidazole compound is used as the radiation-sensitive polymerization initiator [G], a dialkylamino group-containing aliphatic or aromatic compound (hereinafter, referred to as "amino sensitizer") can be added for the purpose of increasing the sensitivity of the biimidazole compound.

Examples of such an amino sensitizer include 4,4'-bis (dimethylamino)benzophenone and 4,4'-bis(diethylamino) benzophenone. Thereamong, 4,4'-bis(diethylamino)benzophenone is particularly preferred. These amino sensitizers may be used individually, or two or more thereof may be used.

Further, when a biimidazole compound and an amino sensitizer are used in combination, a thiol compound can be added as a hydrogen radical donor. Although the biimidazole compound is sensitized and cleaved by the amino sensitizer to generate an imidazole radical, high polymerization-initiating ability may not be expressed in this state. By adding a thiol compound to the system in which the biimidazole compound and the amino sensitizer coexist, a hydrogen radical is donated from the thiol compound to the imidazole radical, as a result of which not only the imidazole radical is converted into neutral imidazole but also a sulfur radical-containing component having high polymerization-initiating ability is generated. Thus, when a biimidazole compound, an amino sensitizer and a thiol compound are added to the resin composition, a film having high hardness can be formed even at a low radiation dose.

Specific examples of such a thiol compound include aromatic thiol compounds such as 2-mercaptobenzothiazole, 2-mercaptobenzoxazole, 2-mercaptobenzimidazole and 2-mercapto-5-methoxybenzothiazole; aliphatic monothiol compounds such as 3-mercaptopropionic acid and methyl 3-mercaptopropionate; and bifunctional or higher functional aliphatic thiol compounds such as pentaerythritol tetra(mercaptoacetate) and pentaerythritol tetra(3-mercaptopropionate).

These thiol compounds may be used individually, or two or more thereof may be used.

Among these thiol compounds, 2-mercaptobenzothiazole is particularly preferred.

When a biimidazole compound and an amino sensitizer are used in combination, the amino sensitizer is used in an amount of preferably 0.1 to 50 parts by mass, more preferably 1 to 20 parts by mass, with respect to 100 parts by mass of the biimidazole compound. By controlling the amount of the amino sensitizer in this range, the reactivity of the composition at the time of exposure can be improved.

Further, when a biimidazole compound, an amino sensitizer and a thiol compound are used in combination, the thiol compound is used in an amount of preferably 0.1 to 50 parts by mass, more preferably 1 to 20 parts by mass, with respect to 100 parts by mass of the biimidazole compound. By controlling the amount of the thiol compound in this range, the reactivity of the composition at the time of exposure can be further improved.

When the resin composition contains the radiation-sensitive polymerization initiator [G], it is preferred that the resin composition also contains at least one selected from the group consisting of O-acyloxime compounds and acetophenone compounds, and the resin composition may further contain a biimidazole compound.

The radiation-sensitive polymerization initiator [G] may be used individually, or two or more thereof may be used.

The radiation-sensitive polymerization initiator [G] is used in an amount of preferably 0.05 to 50 parts by mass, more preferably 0.1 to 20 parts by mass, with respect to 100 parts by mass of the polymer W. By controlling the amount of the radiation-sensitive polymerization initiator [G] in this range, a coating film can be cured with high radiation sensitivity even at a low exposure dose.

<Other Optional Components>

The resin composition may further contain other optional component(s) as long as the effects of the present invention are not impaired.

Examples of other optional components include surfactants, storage stabilizers, adhesion aids, and heat resistance-improving agents.

Such other optional components may be used individually, or two or more thereof may be used.

[Electroconductive Film-forming Composition]

The above-described electroconductive film-forming composition is not particularly restricted. The electroconductive film-forming composition may be any composition capable of forming an electroconductive film and is preferably a liquid ink or paste having fluidity.

Examples of the electroconductive film-forming composition include electroconductive film-forming inks; electroconductive film-forming pastes; coloring inks containing a pigment and/or a dye; coloring pastes; organic semiconductor solutions and oxide semiconductor dispersions; organic EL light-emitting material solutions; and inks containing quantum dots or nanocarbon such as carbon nanotubes, graphene and carbon black.

Thereamong, electroconductive film-forming inks and electroconductive film-forming pastes are preferred. Specifically, an ink or paste in which metal particles are dispersed, an ink or paste containing a metal salt and a reducing agent, an ink or paste in which metal oxide particles that can be metallized by heating under a reducing atmosphere are dispersed, a dispersion or solution of a conductive polymer, and an ink or paste in which nanocarbon such as carbon nanotube or graphene is dispersed are preferred and, from the standpoints of the electroconductivity and coating properties, an ink or paste in which metal particles are dispersed and an ink or paste containing a metal salt and a reducing agent are particularly preferred.

These inks or pastes can be used for forming a coating film by a variety of printing methods, coating methods, immersion methods and the like, and an electrically conductive film (electroconductive film) is obtained by heating the resulting coating film.

As such inks or pastes, those having a viscosity (temperature: 20° C., shear rate: 10 sec$^{-1}$) in a range of preferably 0.001 to 100 Pa·s, more preferably 0.001 to 1 Pa·s, are desired.

For the formation of an electroconductive film, from the standpoints of the coating properties, ease of handling, ease of storage and the like, it is conventionally required to use an electroconductive film-forming composition having a low viscosity (temperature: 20° C., shear rate: 10 sec$^{-1}$) of 0.001 to 100 Pa·s, preferably 0.001 to 1 Pa·s; however, in a conventional method of producing an electroconductive film, because of wet-spreading, bleeding and the like of the electroconductive film-forming composition, such a low-viscosity composition cannot be used for the production of a high-resolution electroconductive film.

On the other hand, in the present invention, even when the above-described low-viscosity electroconductive film-forming composition is used, since an electroconductive film is formed on the above-described recessed pattern, wet-spreading and bleeding of the composition are inhibited, so that a high-resolution electroconductive film can be produced.

Therefore, from the standpoint of allowing the effects of the present invention to be exhibited more prominently, it is preferred to use the low-viscosity electroconductive film-forming composition.

(Metal Salt)

In the above-described metal salt, the metal ion contained therein is reduced to a simple metal by the above-described reducing agent. This simple metal plays a role in allowing the resulting film to express electroconductivity. For example, when the metal salt is a copper salt, the copper ion contained in the copper salt is reduced to a simple copper by the reducing agent and an electroconductive film is thereby formed.

The metal salt is preferably a copper salt or a silver salt.

The metal salt may be used individually, or two or more thereof may be used.

The copper salt is not particularly restricted as long as it is a copper ion-containing compound, and examples thereof include copper salts composed of a copper ion and at least one of inorganic anion species and organic anionic species. Thereamong, from the standpoint of the solubility, it is preferred to use one or more selected from the group consisting of copper carboxylates, copper hydroxides, and complex salts of copper and an acetylacetone derivative.

Preferred examples of the copper carboxylates include copper salts of dicarboxylic acids such as copper malonate, copper succinate and copper maleate; copper salts of aromatic carboxylic acids such as copper benzoate and copper salicylate; and copper salts of organic acids having a monocarboxy group, such as copper acetate, copper trifluoroacetate, copper propionate, copper butyrate, copper isobutyrate, copper 2-methylbutyrate, copper 2-ethylbutyrate, copper valerate, copper isovalerate, copper pivalate, copper hexanoate, copper heptanoate, copper octanoate, copper 2-ethylhexanoate, copper nonanoate, copper formate, copper hydroxyacetate, copper glyoxylate, copper lactate, copper oxalate, copper tartrate, copper malate and copper citrate. It is noted here that copper formate may be an anhydride or a hydrate. The hydrate of copper formate includes, for example, copper formate tetrahydrate.

Preferred examples of the complex salts of copper and an acetylacetone derivative include acetylacetonato copper, 1,1,1-trimethylacetylacetonato copper, 1,1,1,5,5,5-hexamethylacetylacetonato copper, 1,1,1-trifluoroacetylacetonato copper, and 1,1,1,5,5,5-hexafluoroacetylacetonato copper.

Thereamong, considering the solubility and dispersibility in the reducing agent or solvent and the electric resistance properties of the resulting electroconductive film, copper carboxylates such as copper acetate, copper propionate, copper isobutyrate, copper valerate, copper isovalerate, copper formate, copper formate tetrahydrate and copper glyoxylate are preferred.

The silver salt is not particularly restricted as long as it is a salt of silver.

Examples the silver salt include silver nitrate, silver acetate, silver oxide, acetylacetone silver, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate.

As the metal salt, from the standpoint of inhibiting the migration of metal atoms in the resulting electroconductive film, it is preferred to use a copper salt. Among copper salts, copper formate having particularly excellent reducibility is preferred. Copper formate may be an anhydride or copper formate tetrahydrate.

In the electroconductive film-forming composition, the content of the metal salt is in a range of preferably 0.01 to 50% by mass, more preferably 0.1 to 30% by mass, with respect to the total amount of the composition. By controlling the content of the metal salt in this range, an electroconductive film having stable and excellent electroconductivity can be formed. From the standpoint of obtaining an electroconductive film having a low resistance value, the content of the metal salt is preferably not less than 0.01% by mass. Further, from the standpoint of obtaining a chemically stable electroconductive film-forming composition, the content of the metal salt is preferably 50% by mass or less.

(Reducing Agent) For the purpose of reducing the metal ion contained in the metal salt to a simple metal, it is preferred that the electroconductive film-forming composition contain a reducing agent together with the metal salt. The reducing agent is not particularly restricted as long as it has an ability to reduce the metal ion contained in the metal salt to be used.

Examples of the reducing agent include monomolecular compounds having one or more functional groups selected from the group consisting of a thiol group, a nitrile group, an amino group, a hydroxy group and a hydroxycarbonyl group; and polymers having one or more heteroatoms selected from the group consisting of a nitrogen atom, an oxygen atom and a sulfur atom in the molecular structure.

Examples of the monomolecular compounds include alkanethiols, amines, hydrazines, monoalcohols, diols, hydroxyamines, α-hydroxyketones, and carboxylic acids.

Examples of the polymers include polyvinylpyrrolidone, polyethylene imines, polyanilines, polypyrroles, polythiophenes, polyacrylamides, polyacrylic acids, carboxymethyl celluloses, polyvinyl alcohols, and polyethylene oxides.

Thereamong, considering the solubility and the like of the metal salt, the reducing agent is preferably one or more selected from the group consisting of alkanethiols and amines.

Examples of the alkanethiols include ethanethiol, n-propanethiol, i-propanethiol, n-butanethiol, i-butanethiol, t-butanethiol, n-pentanethiol, n-hexanethiol, n-heptanethiol, n-octanethiol, and 2-ethylhexanethiol.

Examples of the amines include amine compounds, for example, monoamine compounds such as 3-(2-ethylhexyloxy)propylamine, ethylamine, n-propylamine, i-propylamine, n-butylamine, i-butylamine, t-butylamine, n-pentylamine, n-hexylamine, cyclohexylamine, n-heptylamine, n-octylamine, 2-ethylhexylamine, 2-ethylhexylpropylamine, 3-ethoxypropylamine, n-nonylamine, n-decylamine, n-undecylamine, n-dodecylamine, n-tridecylamine, n-tetradecylamine, n-pentadecylamine, n-hexadecylamine, benzylamine and aminoacetaldehyde diethyl acetal; diamine compounds such as ethylenediamine, N-methylethylenediamine, N,N'-dimethylethylenediamine, N,N,N',N'-tetramethylethylenediamine, N-ethylethylenediamine, N,N'-diethylethylenediamine, 1,3-propanediamine, N,N'-dimethyl- 1,3-propanediamine, 1,4-butanediamine, N,N'-dimethyl-1,4-butanediamine, 1,5-pentanediamine, N,N'-dimethyl-1,5-pentanediamine, 1,6-hexanediamine, N,N'-dimethyl-1,6-hexanediamine and isophoronediamine; and triamine compounds such as diethylenetriamine, N, N, N'-pentamethyldiethylene triamine, N-(aminoethyl)piperazine and N-(aminopropyl)piperazine.

Examples of the hydrazines include 1, 1-di-n-butylhydrazine, 1,1-di-t-butylhydrazine, 1,1-di-n-pentylhydrazine, 1,1-di-n-hexylhydrazine, 1,1-dicyclohexylhydrazine, 1,1-di-n-heptylhydrazine, 1,1-di-n-octylhydrazine, 1,1-di-(2-ethylhexyl)hydrazine, 1,1-diphenylhydrazine, 1,1-dibenzylhydrazine, 1,2-di-n-butylhydrazine, 1,2-di-t-butylhydrazine, 1,2-di-n-pentylhydrazine, 1,2-di-n-hexylhydrazine, 1,2-dicyclohexylhydrazine, 1,2-di-n-heptylhydrazine, 1,2-di-n-octylhydrazine, 1,2-di-(2-ethylhexyl)hydrazine, 1,2-diphenylhydrazine, and 1,2-dibenzylhydrazine.

Examples of the monoalcohols include methanol, ethanol, n-propyl alcohol, i-propyl alcohol, n-butyl alcohol, i-butyl alcohol, sec-butyl alcohol, pentanol, hexanol, heptanol, octanol, cyclohexanol, benzyl alcohol, and terpineol.

Examples of the diols include ethylene glycol, propylene glycol, 1,2-butanediol, 1,2-pentanediol, 1,2-hexanediol, 2,3-butanediol, 2,3-pentanediol, 2,3-hexanediol, 2,3-heptanediol, 3,4-hexanediol, 3,4-heptanediol, 3,4-octanediol, 3,4-nonanediol, 3,4-decanediol, 4,5-octanediol, 4,5-nonanediol, 4,5-decanediol, 5,6-decanediol, 3-N,N-dimethylamino-1,2-propanediol, 3-N,N-diethylamino-1,2-propanediol, 3-N,N-di-n-propylamino-1,2-propanediol, 3-N,N-di-i-propylamino-1,2-propanediol, 3-N,N-di-n-butylamino-1,2-propanediol, 3-N,N-di-i-butylamino-1,2-propanediol, and 3-N,N-di-t-butylamino-1,2-propanediol.

Examples of the hydroxyamines include N,N-diethylhydroxylamine, N,N-di-n-propylhydroxylamine, N,N-di-n-butylhydroxylamine, N,N-di-n-pentylhydroxylamine, and N,N-di-n-hexylhydroxylamine.

Examples of the α-hydroxyketones include hydroxyacetone, 1-hydroxy-2-butanone, 3-hydroxy-2-butanone, 1-hydroxy-2-pentanone, 3-hydroxy-2-pentanone, 2-hydroxy-3-pentanone, 3-hydroxy-2-hexanone, 2-hydroxy-3-hexanone, 4-hydroxy-3-hexanone, 4-hydroxy-3-heptanone, 3-hydroxy-4-heptanone, and 5-hydroxy-4-octanone.

The carboxylic acids are not particularly restricted as long as they have an ability to reduce metal salts, and examples thereof include formic acid, hydroxyacetic acid, glyoxylic acid, lactic acid, oxalic acid, tartaric acid, malic acid, and citric acid.

The above-described reducing agents can be used in accordance with the type of the metal salt by appropriately selecting or combining one or more of the reducing agents capable of reducing the metal salt. For example, when copper formate is used as the metal salt, the reducing agent is preferably an amine compound, more preferably 2-ethylhexylpropylamine or 3-ethoxypropylamine.

In the electroconductive film-forming composition, the content of the reducing agent is in a range of preferably 1 to 99% by mass, more preferably 10 to 90% by mass, with respect to the total amount of the composition. By controlling the content of the reducing agent in a range of 1 to 99% by mass, an electroconductive film having excellent electroconductivity can be formed. Further, by controlling the content of the reducing agent in a range of 10 to 90% by mass, an electroconductive film having a low resistance value and showing excellent adhesion with an electrode can be formed.

(Metal Fine Particles)

In the electroconductive film-forming composition, metal fine particles may be incorporated for the purpose of improving the reduction and precipitation rate of the metal salt or adjusting the viscosity of the composition.

The metal fine particles are not particularly restricted; however, from the standpoint of the electroconductivity and stability of the particles, they are preferably particles containing one or more metal species selected from the group consisting of gold, silver, copper, platinum and palladium. These metal species may be simple metals or alloys with other metal. When these metal species are simple metals, preferred metal fine particles are, for example, at least one or a combination of two or more selected from the group consisting of gold fine particles, silver fine particles, copper fine particles, platinum fine particles and palladium fine particles.

Among these metal fine particles, from the standpoints of the cost, availability and catalytic ability in the formation of an electroconductive film, metal fine particles containing one or more metal species selected from the group consisting of silver, copper and palladium are preferred. Other metal fine particles may be used; however, for example, when a copper salt is used as the metal salt, since the rate of reduction and precipitation from the copper salt to metallic copper may be reduced due to oxidation of metal fine particles by copper ion and/or reduction in the catalytic ability, it is more preferred to use the above-described metal fine particles.

The average particle size of the metal fine particles is preferably in a range of 0.05 µm to 5 µm. From the standpoints of preventing the occurrence of oxidation reaction caused by an increase in the activity of the metal surface and inhibiting aggregation of the metal fine particles, the particle size of the metal fine particles is preferably not smaller than 0.05 µm. Further, from the standpoint of inhibiting sedimentation of the metal fine particles during long-term storage of the electroconductive film-forming composition, the average particle size of the metal fine particles is preferably 5 µm or smaller.

The average particle size is measured by the following method.

In a field of view observed under a microscope such as a transmission electron microscope (TEM), a field emission-type transmission electron microscope (FE-TEM) or a field emission-type scanning electron microscope (FE-SEM), three spots are arbitrarily selected and photographed at the optimum magnification for particle size measurement. In each of the thus obtained photographs, 100 particles are arbitrarily selected, and the long axes of these particles are measured under a TEM, FE-TEM, FE-SEM or the like. The sizes of the particles are calculated by dividing the thus measured values by the measurement magnification, and the average particle size can be determined by taking an arithmetic mean of the thus calculated values. Further, the standard deviation can be determined based on the particle sizes and the number of the metal fine particles at the time of the above-described observation.

The metal fine particles are not particularly restricted and may be commercially available ones or those synthesized by a known method. Examples of a known synthesis method include vapor-phase methods (dry process) such as sputtering and vapor deposition; and liquid phase methods (wet process) such as a method of allowing metal fine particles to precipitate by reducing a metal compound solution in the presence of a surface protective agent.

The metal purity of the metal fine particles is not particularly restricted; however, since the electroconductivity of the resulting electroconductive film may be adversely affected when the metal purity is low, the metal purity is preferably not lower than 95%, more preferably not lower than 99%.

In the electroconductive film-forming composition, the content of the metal fine particles is in a range of preferably 0 to 60% by mass, more preferably 1 to 40% by mass, particularly preferably 1 to 20% by mass, with respect to the total amount of the composition.

(Solvent)

In the electroconductive film-forming composition, from the standpoints of adjusting the viscosity of the composition to improve the productivity of an electroconductive film and obtaining a low-resistance and uniform electroconductive film, it is preferred to incorporate a solvent.

Examples of the solvent include organic solvents which are capable of dissolving or dispersing the components of the electroconductive film-forming composition and do not participate in the reduction reaction of the metal salt. Specific examples thereof include mixtures of one or two or more compatible solvents selected from the group consisting of ethers, esters, aliphatic hydrocarbons and aromatic hydrocarbons.

Examples of the ethers, aliphatic hydrocarbons and aromatic hydrocarbons include those compounds exemplified above as the solvent [B].

Examples of the esters include methyl formate, ethyl formate, butyl formate, γ-butyrolactone, and those compounds exemplified above as the solvent [B].

Among these organic solvents, particularly from the standpoint of the ease of adjusting the viscosity, ethers are preferred, and hexylmethyl ether, diethylene glycol dimethyl ether and the like are particularly preferred.

The content of the solvent in the electroconductive film-forming composition is in a range of preferably 0 to 95%, by mass, more preferably 1 to 70% by mass, particularly preferably 10 to 50% by mass, with respect to the total amount of the composition.

The electroconductive film-forming composition can be produced by mixing the above-described components. The mixing method is not particularly restricted, and examples thereof include stirring with a stirring blade, stirring with a stirrer or a stirrer bar, stirring with a boiling shaker, and stirring with ultrasonic waves (homogenizer). As for the stirring conditions, for example, in the case of stirring with a stirring blade, the rotational speed of the stirring blade is usually in a range of 1 to 4,000 rpm, preferably in a range of 100 to 2,000 rpm.

EXAMPLES

The present invention will now be described in detail by way of examples thereof; however, the present invention should not be construed as being limited thereto.

[GPC Analysis]

The weight-average molecular weight (Mw) and molecular weight distribution (Mw/Mn) of each polymer obtained in the below-described Synthesis Examples were measured in terms of polystyrene under the following conditions.

Measurement method: gel permeation chromatography (GPC)
Standard substance: polystyrene
Apparatus: manufactured by Tosoh Corporation, trade name: HLC-8220
Columns: Guard Column $H_{XL}$-H, TSK gel G7000$H_{XL}$, 2×TSK gel GMH$_{XL}$ and TSK gel G2000$H_{XL}$, manufactured by Tosoh Corporation and sequentially connected
Solvent: tetrahydrofuran
Sample concentration: 0.7% by mass
Injection volume: 70 μL
Flow rate: 1 mL/min

[Measurement of $^1$H-NMR]

$^1$H-NMR was measured in a CDCl$_3$ solvent using a nuclear magnetic resonance apparatus (AVANCE III AV400N, manufactured by Bruker BioSpin K.K.) at a temperature of 25° C.

<Synthesis of Polymers>

Synthesis Example 1

To a flask equipped with a condenser and a stirrer, 8 parts by mass of dimethyl-2,2'-azobis(2-methylpropionate), 2 parts by mass of 2,4-diphenyl-4-methyl-1-pentene and 200 parts by mass of diethylene glycol dimethyl ether were added. Subsequently, 42 parts by mass of 2-hydroxyethyl methacrylate and 58 parts by mass of benzyl methacrylate were further added and, under a nitrogen atmosphere, the temperature of the solution was raised to 80° C. with gentle stirring and this temperature was maintained for 4 hours to perform polymerization, whereby a solution containing a polymer (A-1), which is a copolymer, was obtained (solid concentration=34.6% by mass, Mw=26,000, Mw/Mn=2.2). It is noted here that the solid concentration means a ratio of the mass of the copolymer with respect to the total mass of the copolymer solution.

Then, 13 parts by mass of diethylene glycol dimethyl ether and 4.8 parts by mass of 3,3,4,4,5,5,6,6,7,7,8,8,8-tridecafluoro-1-vinyloxyoctane were added to 10 parts by mass of the thus obtained solution containing the polymer (A-1). After sufficiently stirring the resulting solution, 0.27 parts by mass of trifluoroacetic acid was added, and the solution was allowed to react under a nitrogen atmosphere at 80° C. for 9 hours. Then, this reaction solution was cooled to room temperature, and the reaction was quenched with an addition of 0.3 parts by mass of pyridine. The thus obtained reaction solution was subjected to reprecipitation and purification by adding the solution dropwise to a large excess of methanol. Thereafter, the resulting precipitates were dissolved in 10 parts by mass of diethylene glycol dimethyl ether, and the resulting solution was subjected to reprecipitation and purification by adding the solution dropwise to a large excess of hexane, after which the resulting precipitates were dried to obtain 6.8 parts by mass of a polymer [A] (P-1) as a white solid copolymer. The thus obtained polymer [A] (P-1) was analyzed by $^1$H-NMR to confirm the progress of acetalization (chemical shift: 4.80 ppm, acetal group C—H).

Synthesis Example 2

To a flask equipped with a condenser and a stirrer, 8 parts by mass of dimethyl-2,2'-azobis(2-methylpropionate), 2 parts by mass of pentaerythritol tetrakis(3-mercaptopropionate) and 200 parts by mass of propylene glycol monomethyl ether were added. Subsequently, 75 parts by mass of 2-hydroxyethyl methacrylate and 25 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer (A-2), which is a copolymer, was obtained. The thus obtained solution was added dropwise to a large excess of hexane, and the resulting precipitates were dried to obtain a white solid polymer (A-2) (Mw=28,000, Mw/Mn=2.3).

Then, 5 parts by mass of the thus obtained polymer (A-2) was dissolved in 42 parts by mass of tetrahydrofuran, and 12.4 parts by mass of 3,3,4,4,5,5,6,6,7,7,8,8,8-tridecafluoro-1-vinyloxyoctane was added thereto. After sufficiently stirring the resulting solution, 0.66 parts by mass of trifluoroacetic acid was added, and the solution was allowed to react under a nitrogen atmosphere at 80° C. for 9 hours. Then, this reaction solution was cooled to room temperature, and the reaction was quenched with an addition of 0.7 parts by mass of pyridine. The thus obtained reaction solution was subjected to reprecipitation and purification by adding the solution dropwise to an excess amount of methanol. Thereafter, the resulting precipitates were dissolved again in 15 parts by mass of diethylene glycol dimethyl ether, and the resulting solution was subjected to reprecipitation and purification by adding the solution dropwise to hexane, after which the resulting precipitates were dried to obtain 11.0 parts by mass of a polymer [A] (P-2) as a white solid copolymer. The thus obtained polymer [A] (P-2) was analyzed by $^1$H-NMR to confirm the progress of acetalization (chemical shift: 4.80 ppm, acetal group C—H).

Synthesis Example 3

To a flask equipped with a condenser and a stirrer, 8 parts by mass of dimethyl-2,2'-azobis(2-methylpropionate), 2 parts by mass of 2,4-diphenyl-4-methyl-1-pentene and 200 parts by mass of propylene glycol monomethyl ether were added. Subsequently, 30 parts by mass of methacrylic acid and 70 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer (A-3), which is a copolymer, was obtained. The thus obtained solution was added dropwise to a large excess of hexane, and the resulting precipitates were dried to obtain a white solid polymer (A-3) (Mw=24,000, Mw/Mn=2.2).

Then, 5 parts by mass of the thus obtained polymer (A-3) was dissolved in 34 parts by mass of diethylene glycol dimethyl ether, and 9.4 parts by mass of 3,3,4,4,5,5,6,6,7,7,8,8,9,9,10,10,10-heptadecafluoro-1-vinyloxydecane was added thereto. After sufficiently stirring the resulting solution, 0.09 parts by mass of pyridinium p-toluenesulfonate was added, and the solution was allowed to react under a nitrogen atmosphere at 80° C. for 5 hours. Then, this reaction solution was cooled to room temperature, and the reaction was quenched with an addition of 0.04 parts by mass of pyridine. The thus obtained reaction solution was subjected to reprecipitation and purification by adding the solution dropwise to an excess amount of methanol. Thereafter, the resulting precipitates were dissolved again in 15 parts by mass of diethylene glycol dimethyl ether, and the resulting solution was subjected to reprecipitation and purification by adding the solution dropwise to hexane, after which the resulting precipitates were dried to obtain 10.9 parts by mass of a polymer [A] (P-3) as a white solid copolymer. The thus obtained polymer [A] (P-3) was analyzed by $^1$H-NMR to confirm the progress of acetalization (chemical shift: 5.74 ppm, acetal group C—H).

Synthesis Example 4

To a flask equipped with a condenser and a stirrer, 8 parts by mass of dimethyl-2,2-azobis(2-methylpropionate), 2 parts by mass of 2,4-diphenyl-4-methyl-1-pentene and 200 parts by mass of propylene glycol monomethyl ether were added. Subsequently, 60 parts by mass of 2-methacryloyloxy ethylsuccinic acid and 40 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer (A-4), which is a copolymer, was obtained. The thus obtained solution was added dropwise to a large excess of hexane, and the resulting precipitates were dried to obtain a white solid polymer (A-4) (Mw=23,400, Mw/Mn=2.2).

Then, 5 parts by mass of the thus obtained polymer (A-4) was dissolved in 20 parts by mass of tetrahydrofuran, and 3.5 parts by mass of 3,3,4,4,5,5,6,6,6-nonafluoro-1-vinyloxyhexane was added thereto. After sufficiently stirring the resulting solution, 0.06 parts by mass of pyridinium p-toluenesulfonate was added, and the solution was allowed to react under a nitrogen atmosphere at 60° C. for 5 hours. Then, this reaction solution was cooled to room temperature, and the reaction was quenched with an addition of 0.03 parts by mass of pyridine. The thus obtained reaction solution was subjected to reprecipitation and purification by adding the solution dropwise to an excess amount of methanol. Thereafter, the resulting precipitates were dissolved again in 15 parts by mass of tetrahydrofuran, and the resulting solution was subjected to reprecipitation and purification by adding the solution dropwise to hexane, after which the resulting precipitates were dried to obtain 6.0 parts by mass of a polymer [A] (P-4) as a white solid copolymer. The thus obtained polymer [A] (P-4) was analyzed by $^1$H-NMR to confirm the progress of acetalization (chemical shift: 5.74 ppm, acetal group C—H).

Synthesis Example 5

In a flask equipped with a condenser and a stirrer, 5 parts by mass of a polyvinyl phenol (MARUKA LYNCUR S-4P, manufactured by Maruzen Petrochemical Co., Ltd.) was dissolved in 50 parts by mass of tetrahydrofuran, and 16 parts by mass of 3,3,4,4,5,5,6,6,7,7,8,8,8-tridecafluoro-1-vinyloxyoctane was added thereto. After sufficiently stirring the resulting solution, 0.50 parts by mass of trifluoroacetic acid was added, and the solution was allowed to react under a nitrogen atmosphere at 60° C. for 9 hours. Then, this reaction solution was cooled to room temperature, and the reaction was quenched with an addition of 0.5 parts by mass of pyridine. The thus obtained reaction solution was subjected to reprecipitation and purification by adding the solution dropwise to an excess amount of methanol. Thereafter, the resulting precipitates were dissolved again in 30 parts by mass of tetrahydrofuran, and the resulting solution was subjected to reprecipitation and purification by adding the solution dropwise to hexane, after which the resulting precipitates were dried to obtain a polymer [A] (P-5) as a white solid copolymer. The thus obtained polymer [A] (P-5) was analyzed by $^1$H-NMR to confirm the progress of acetalization (chemical shift: 5.48 ppm, acetal group C—H).

Synthesis Example 6

In a flask equipped with a condenser and a stirrer, 5 parts by mass of a phenol novolac resin P-200 represented by the Formula below (manufactured by Arakawa Chemical Industries, Ltd.) was dissolved in 60 parts by mass of tetrahydrofuran, and 20 parts by mass of 3,3,4,4,5,5,6,6,7,7,8,8,9,9, 10,10,10-heptadecafluoro-1-vinyloxydecane was added thereto. After sufficiently stirring the resulting solution, 0.50 parts by mass of trifluoroacetic acid was added, and the solution was allowed to react under a nitrogen atmosphere at 60° C. for 9 hours. Then, this reaction solution was cooled to room temperature, and the reaction was quenched with an addition of 0.5 parts by mass of pyridine. The thus obtained reaction solution was subjected to reprecipitation and purification by adding the solution dropwise to an excess amount of methanol. Thereafter, the resulting precipitates were dissolved again in 30 parts by mass of tetrahydrofuran, and the resulting solution was subjected to reprecipitation and purification by adding the solution dropwise to hexane, after which the resulting precipitates were dried to obtain 12.1 parts by mass of a polymer [A] (P-6) as a white solid copolymer. The thus obtained polymer [A] (P-6) was analyzed by ¹H-NMR to confirm the progress of acetalization (chemical shift: 5.49 ppm, acetal group C—H).

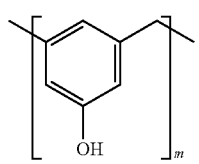

P-200

Synthesis Example 7

To a flask equipped with a condenser and a stirrer, 25 parts by mass of 2-hydroxyethyl methacrylate, 101 parts by mass of 3,3,4,4,5,5,6,6,7,7,8,8,8-tridecafluoro-1-vinyloxyoctane, 2.0 parts by mass of trifluoroacetic acid (TFA) and 200 parts by mass of tetrahydrofuran (THF) were added, and these materials were allowed to react under a nitrogen atmosphere by maintaining the temperature at 60° C. for 9 hours. After cooling the resulting reaction solution, the reaction was quenched by adding thereto 2.1 parts by mass of pyridine. This reaction solution was washed with water and separated, after which the solvent was removed using a rotary evaporator and unreacted components were removed by vacuum distillation, whereby an acetalization product (M-1) was obtained.

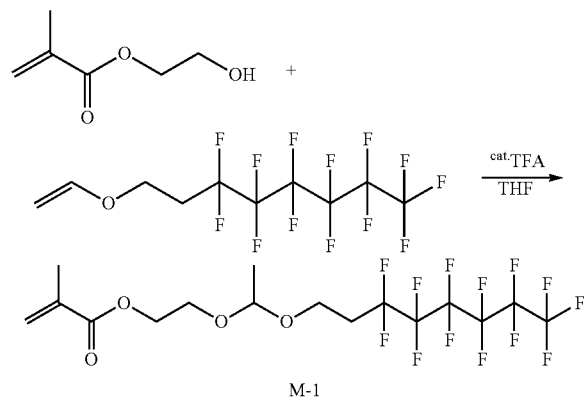

M-1

To a flask equipped with a condenser and a stirrer, 8 parts by mass of dimethyl-2,2'-azobis(2-methylpropionate), 2 parts by mass of 2,4-diphenyl-4-methyl-1-pentene and 200 parts by mass of propylene glycol monomethyl ether were added. Subsequently, 70 parts by mass of the thus obtained acetalization product (M-1) and 30 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer [A] (P-7), which is a copolymer, was obtained (Mw=22,200, Mw/Mn=2.3, ¹H-NMR chemical shift: 4.80 ppm, acetal group C—H).

Synthesis Example 8

To a flask equipped with a condenser and a stirrer, 25 parts by mass of hydroxyphenyl methacrylate, 82 parts by mass of 3,3,4,4,5,5,6,6,7,7,8,8,8-tridecafluoro-1-vinyloxyoctane, 1.6 parts by mass of trifluoroacetic acid (TFA) and 200 parts by mass of tetrahydrofuran (THF) were added, and these materials were allowed to react under a nitrogen atmosphere by maintaining the temperature at 60° C. for 9 hours. After cooling the resulting reaction solution, the reaction was quenched by adding thereto 1.7 parts by mass of pyridine. This reaction solution was washed with water and separated, after which the solvent was removed using a rotary evaporator and unreacted components were removed by vacuum distillation, whereby an acetalization product (M-2) was obtained.

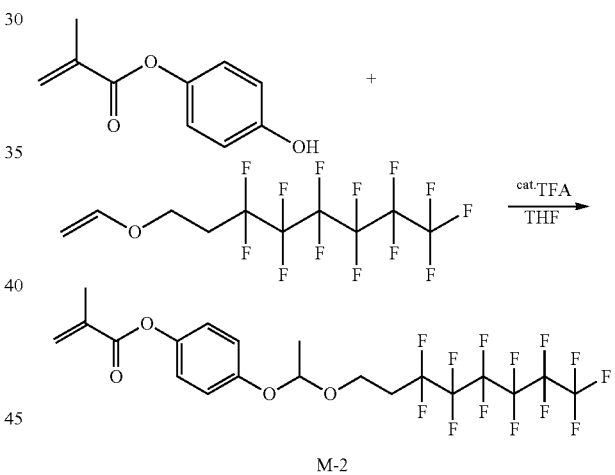

M-2

To a flask equipped with a condenser and a stirrer, 8 parts by mass of dimethyl-2,2'-azobis(2-methylpropionate), 2 parts by mass of 2,4-diphenyl-4-methyl-1-pentene and 200 parts by mass of propylene glycol monomethyl ether were added. Subsequently, 75 parts by mass of the thus obtained acetalization product (M-2) and 25 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer [A] (P-8), which is a copolymer, was obtained (Mw=23,200, Mw/Mn=2.2, ¹H-NMR chemical shift: 5.50 ppm, acetal group C—H).

Synthesis Example 9

To a flask equipped with a condenser and a stirrer, 25 parts by mass of 2-(2-vinyloxyethoxy)ethyl methacrylate (VEEM, manufactured by Nippon Shokubai Co., Ltd.), 45 parts by mass of 3,3,4,4,5,5,6,6,7,7,8,8,8-tridecafluorooctanol, 1.6 parts by mass of pyridinium p-toluenesulfonate (PPTSA) and 200 parts by mass of tetrahydrofuran (THF) were added, and these materials were allowed to react under a nitrogen atmosphere by maintaining the temperature at room temperature for 8 hours. Thereafter, the reaction was quenched by adding 0.7 parts by mass of pyridine to the resulting reaction solution. This reaction solution was washed with water and separated, after which the solvent was removed using a rotary evaporator and unreacted components were removed by vacuum distillation, whereby an acetalization product (M-3) was obtained.

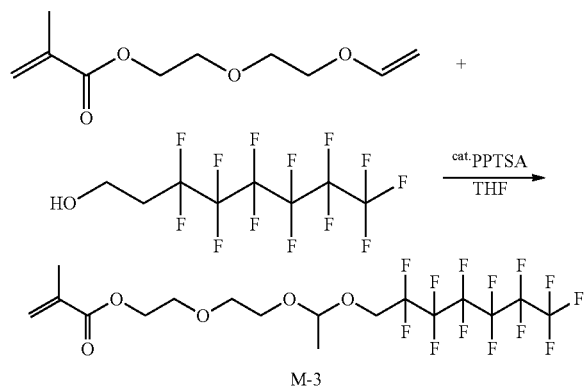

M-3

To a flask equipped with a condenser and a stirrer, 8 parts by mass of dimethyl-2,2'-azobis(2-methylpropionate), 2 parts by mass of 2,4-diphenyl-4-methyl-1-pentene and 200 parts by mass of propylene glycol monomethyl ether were added. Subsequently, 75 parts by mass of the thus obtained acetalization product (M-3) and 25 parts by mass of benzyl methacrylate were further added and, after purging the resulting solution with nitrogen, the temperature of the solution was raised to 80° C. with gentle stirring and this temperature was maintained for 4 hours to perform polymerization, whereby a solution containing a polymer [A] (P-9), which is a copolymer, was obtained (Mw=24,200, Mw/Mn=2.1, chemical shift: 4.80 ppm, acetal group C—H).

<Preparation of Resin Compositions>

The components used in Examples and Comparative Examples are described below in detail.

<Acid Generator [C]>
C-1: N-hydroxynaphthalimide-trifluoromethane sulfonic acid ester
C-2: 4,7-di-n-butoxy-1-naphthyltetrahydrothiophenium trifluoromethanesulfonate
C-3: CGI725 (manufactured by BASF)

<Sensitizer [D]>
D-1: 2-isopropylthioxanthone
D-2: 2,4-diethylthioxanthen-9-one

<Quencher [E]>
E-1: 2-phenylbenzimidazole
E-2: 4-(dimethylamino)pyridine

<Polymerizable Compound [F]>
F-1: dipentaerythritol hexaacrylate
F-2: 1,9-nonanediol diacrylate <Radiation-sensitive Polymerization Initiator [G]>
G-1: 2-methyl-1-(4-methylthiophenyl)-2-morpholinopropan-1-one (IRGACURE (registered trademark) 907, manufactured by BASF)
G-2: 2-dimethylamino-2-(4-methylbenzyl)-1-(4-morpholin-4-yl-phenyl)-butan-1-one (IRGACURE (registered trademark) 379, manufactured by BASF)
G-3: ethanone-1-[9-ethyl-6-(2-methylbenzoyl)-9H-carbazol-3-yl]-1-(O-acetyloxime) (IRGACURE (registered trademark) OXE02, manufactured by BASF)

Examples 1 to 9, and Comparative Examples 1 and 2

Each resin composition was prepared by mixing the respective components in accordance with the type and amount shown in Table 1, adding thereto propylene glycol monomethyl ether as the solvent [B] such that the resulting mixture had a solid concentration of 10% by mass, and then filtering the resultant through a membrane filter having a pore size of 0.5 μm (manufactured by Merck Millipore Corporation). It is noted here that, in Table 1, "-" indicates that the corresponding component was not used.

TABLE 1

| | Polymer [A] | | Photoacid Generator [C] | | Sensitizer [D] | | Quencher [E] | | Polymerizable compound [F] | | Radiation-sensitive polymerization initiator [G] | |
|---|---|---|---|---|---|---|---|---|---|---|---|---|
| | Type | Content (parts by mass) | Type | Content (parts by mass) | Type | Content (parts by mass) | Type | Content (parts by mass) | Type | Content (parts by mass) | Type | Content (parts by mass) |
| Example 1 | P-1 | 100 | C-1 | 2 | D-1 | 1 | E-1 | 0.05 | — | — | — | — |
| Example 2 | P-2 | 100 | C-1 | 3 | D-2 | 0.5 | E-1 | 0.05 | — | — | — | — |
| Example 3 | P-3 | 100 | C-2 | 3 | — | — | E-2 | 0.1 | F-1 | 5 | G-1 | 0.2 |
| Example 4 | P-4 | 100 | C-3 | 3 | — | — | E-1 | 0.05 | F-1 | 5 | G-1/G-2 | 0.2/0.2 |
| Example 5 | P-5 | 100 | C-1 | 2 | D-1 | 1 | E-1 | 0.05 | — | — | — | — |
| Example 6 | P-6 | 100 | C-3 | 3 | — | — | E-1 | 0.05 | — | — | — | — |
| Example 7 | P-7 | 100 | C-1 | 3 | D-2 | 0.5 | E-1 | 0.05 | F-1 | 5 | G-3 | 0.2 |
| Example 8 | P-8 | 100 | C-1 | 2 | D-2 | 0.5 | E-2 | 0.1 | — | — | — | — |
| Example 9 | P-9 | 100 | C-2 | 3 | — | — | E-1 | 0.05 | F-2 | 5 | G-2 | 0.5 |
| Comparative Example 1 | A-1 | 100 | C-1 | 2 | D-1 | 1 | E-1 | 0.05 | F-1 | 5 | G-1 | 0.25 |
| Comparative Example 2 | A-3 | 100 | C-1 | 3 | D-2 | 0.5 | E-1 | 0.05 | — | — | — | — |

<Film Evaluation>

Films were formed using the resin compositions prepared in Examples 1 to 9 and Comparative Examples 1 and 2, and the thus obtained films were subjected to the following evaluations. The results thereof are shown in Tables 2 and 3.

[Contact Angle]

The resin compositions prepared in Examples 1 to 9 and Comparative Examples 1 and 2 were each coated on a flat plate made of a polycarbonate/AES (acrylonitrile-ethylene-propylene-diene-styrene) resin (CW50, manufactured by Techno Polymer Co., Ltd.) using a spinner, and the resultant was prebaked in a 90° C. clean oven for 5 minutes to form a 0.5 µm-thick coating film. Subsequently, the thus obtained coating film was irradiated with radiation through a quartz mask (contact) using a high-pressure mercury lamp (exposure machine: MA-1400 manufactured by Japan Science Engineering Co., Ltd.) at an exposure does of 500 mJ/cm². Thereafter, the resultant was baked in a clean oven at 100° C. for 10 minutes to form a coating film.

When the resin compositions prepared in Examples 1 to 9 were used, a film patterned with a lyophilic portion and a liquid-repellent portion, in which the lyophilic portion was derived from the exposed part (recess) and the liquid-repellent portion was derived from the part other than the exposed part (protruded part) (such a film may be hereinafter referred to as "lyophilic/liquid-repellent patterned film") was obtained.

For the thus formed coating films, using a contact angle meter (CA-X, manufactured by Kyowa Interface Science Co., Ltd.), the contact angle of water and that of tetradecane on the coating film surface of the exposed part and the coating film surface of the unexposed part were measured to verify the lyophilic/liquid-repellent performance. In Table 2, the contact angle of water on the surface of the exposed part is shown under "Lyophilic portion: water", and the contact angle of water on the surface of the unexposed part is shown under "Liquid-repellent portion: water". The contact angles of tetradecane are also shown in the same manner.

[Verification of Recess Patterning Properties]

For the films obtained in the same manner as in the above section [Contact Angle], the film thickness of the exposed part (recess) and that of the unexposed part (protruded part) were measured using a contact-type film thickness meter (Alpha-Step IQ, manufactured by Keyence Corporation). Then, the recessed pattern-forming properties were verified by calculating the difference between the film thickness of the unexposed part (liquid-repellent portion) and that of the exposed part (lyophilic portion) and determining the film thickness reduction rate (%) using the following equation:

Film thickness reduction rate (%)=(Film thickness of liquid-repellent portion−Film thickness of lyophilic portion)×100/Film thickness of liquid-repellent portion <Evaluation of Coating on Three-Dimensional Structure>

Films were formed on three-dimensional structures using the resin compositions prepared in Examples 1 to 9 and Comparative Examples 1 and 2, and the resultants were subjected to the following evaluations. The results thereof are shown in Table 2.

[Formation of Recessed Pattern on Three-Dimensional Structure]

On three-dimensional structures a to c having the respective shapes shown in FIGS. 1(A) to (C), the resin compositions prepared in Examples 1 to 9 and Comparative Examples 1 and 2 were each spray-coated, and the resultants were baked in a 90° C. clean oven for 5 minutes to dry out the solvent, thereby forming 0.5 µm-thick coating films.

Then, on the thus obtained coating films, a film seal having a desired light-blocking part and a 500 µm-wide linear transparent part was pasted such that structures having a recessed pattern of the respective shapes shown in FIGS. 2(A) to (C) were formed. These film seal-pasted three-dimensional structures were each irradiated with radiation using a high-pressure mercury lamp (exposure machine: MA-1400 manufactured by Japan Science Engineering Co., Ltd.) such that the coating film was exposed at a dose of 500 mJ/cm². Thereafter, the film seal was peeled off and each structure was baked in a clean oven at 100° C. for 10 minutes to form a coating film.

The three-dimensional structure a is a curved glass, and each resin composition was spray-coated on the entire upper surface of this curved glass shown in FIG. 1(A).

The three-dimensional structure b is a three-dimensional structure made of a polycarbonate/AES resin ("CW50", manufactured by Techno Polymer Co., Ltd.), and each resin composition was spray-coated on the entire upper surface of this three-dimensional structure shown in FIG. 1(B).

The three-dimensional structure c is a three-dimensional structure made of a polycarbonate/ABS (acrylonitrile-butadiene-styrene) resin ("CK50", manufactured by Techno Polymer Co., Ltd.), and each resin composition was spray-coated on the entire surface of this three-dimensional structure.

[Evaluation of Outer Appearance]

Coating film-equipped three-dimensional structures were prepared in the same manner as in the above evaluation of [Formation of Recessed Pattern on Three-dimensional Structure]. For each of these coating film-equipped three-dimensional structures, the outer appearance was visually evaluated as follows: good (0), when a visually verifiable recessed pattern was formed without deterioration of the three-dimensional structure; or poor (x), when no visually verifiable recessed pattern was formed or when film roughness, whitening or the like was visually observed on the three-dimensional structure.

[Evaluation of Adhesion]

Coating film-equipped three-dimensional structures were prepared in the same manner as in the above evaluation of [Formation of Recessed Pattern on Three-dimensional Structure]. For each of these coating film-equipped three-dimensional structures, a cut was made in a recessed pattern-containing 1 cm-square section of the coating film using a cutter knife, and a tape peeling test (CT-18 Cellotape, manufactured by Nichiban Co., Ltd.) was performed on this section to evaluate the adhesion between the coating film and the three-dimensional structure.

The adhesion was evaluated as follows: good (0), when the coating film was not detached; or poor (x), when the coating film was detached.

[Formation of Metal Wiring: Dropping Method]

On the linear recessed pattern of each coating film obtained in the above [Formation of Recessed Pattern on Three-dimensional Structure], a silver nanoink NPS-JL (manufactured by Harima Chemicals Group, Inc.) was applied dropwise and, after the ink stopped flowing, the resultant was baked in a clean oven at 100° C. for 60 minutes to form a silver wiring. The thus formed silver wiring was evaluated as follows: "o", when a 500 µm-wide linear silver wiring was obtained and conduction was confirmed without any wire breakage in the measurement of resistance between two points on the silver wiring that are 10 cm apart using Model 2000 digital multimeter (manufactured by Keithley Instruments, Inc.); or (x), when a 500 µm-wide linear silver wiring was not obtained.

Whether or not a linear silver wiring was obtained was confirmed under a light microscope (ECLIPSE L200D, manufactured by Nikon Corporation).

[Formation of Metal Wiring: Dipping Method]

The three-dimensional structures having a linear recessed pattern obtained in the above [Formation of Recessed Pattern on Three-dimensional Structure] were each immersed in a silver nanoink NPS-JL (manufactured by Harima Chemicals Group, Inc.) for 3 seconds. Then, the three-dimensional structure was pulled out and left to stand in a tilted position when the three-dimensional structure a or b was used (for example, in FIGS. 2(A) and (B), the three-dimensional structure was placed such that its upper surface formed an angle of 60° or larger with respect to the floor), or left to stand as shown in FIG. 2(C) when the three-dimensional structure c was used. Thereafter, the structure was baked in a clean oven at 100° C. for 60 minutes to form a silver wiring. The thus formed silver wiring was evaluated as follows: "○", when a 500 μm-wide linear silver wiring was obtained and conduction was confirmed without any wire breakage in the measurement of resistance between two points on the silver wiring that are 10 cm apart using Model 2000 digital multimeter (manufactured by Keithley Instruments, Inc.); or (x), when a 500 μm-wide linear silver wiring was not obtained.

Whether or not a linear silver wiring was obtained was confirmed under a light microscope (ECLIPSE L200D, manufactured by Nikon Corporation).

[Evaluation of Adhesion of Metal Wiring]

Silver wiring-equipped three-dimensional structures were prepared in the same manner as in the above evaluations of [Formation of Metal Wiring: Dropping Method] and [Formation of Metal Wiring: Dipping Method]. For each of these silver wiring-equipped three-dimensional structures, a cut was made such that a silver wiring was isolated over a length of 1 cm, and a tape peeling test (CT-18 Cellotape, manufactured by Nichiban Co., Ltd.) was performed on this part to evaluate the adhesion between the silver wiring and the coating film.

The adhesion was evaluated as follows: good (○), when the silver wiring was not detached; or poor (x), when the silver wiring was detached.

TABLE 2

| | Recess patterning properties on polycarbonate/AES resin plate | | | | | | Formation of recessed pattern on three-dimensional structure | | | | | |
|---|---|---|---|---|---|---|---|---|---|---|---|---|
| | (Liquid-repellent portion) − (Lyophilic portion) (μm) | Thickness reduction rate (%) | Contact angle (°) on polycarbonate/AES resin plate | | | | Outer appearance | | | Adhesion | | |
| | | | Lyophilic portion: water | Liquid-repellent portion: water | Lyophilic portion: tetradecane | Liquid-repellent portion: tetradecane | Structure a | Structure b | Structure c | Structure a | Structure b | Structure c |
| Example 1 | 0.14 | 28 | 74 | 110 | 4 | 63 | ○ | ○ | ○ | ○ | ○ | ○ |
| Example 2 | 0.28 | 56 | 65 | 118 | 5 | 68 | ○ | ○ | ○ | ○ | ○ | ○ |
| Example 3 | 0.20 | 40 | 68 | 108 | 5 | 61 | ○ | ○ | ○ | ○ | ○ | ○ |
| Example 4 | 0.11 | 22 | 72 | 102 | 4 | 54 | ○ | ○ | ○ | ○ | ○ | ○ |
| Example 5 | 0.26 | 52 | 46 | 110 | 3 | 63 | ○ | ○ | ○ | ○ | ○ | ○ |
| Example 6 | 0.28 | 56 | 45 | 107 | 5 | 62 | ○ | ○ | ○ | ○ | ○ | ○ |
| Example 7 | 0.13 | 26 | 71 | 109 | 4 | 64 | ○ | ○ | ○ | ○ | ○ | ○ |
| Example 8 | 0.16 | 32 | 58 | 101 | 5 | 62 | ○ | ○ | ○ | ○ | ○ | ○ |
| Example 9 | 0.14 | 28 | 73 | 102 | 4 | 63 | ○ | ○ | ○ | ○ | ○ | ○ |
| Comparative Example 1 | 0.01 | 2 | 81 | 82 | 5 | 6 | x | x | x | ○ | ○ | ○ |
| Comparative Example 2 | 0.02 | 4 | 74 | 74 | 6 | 7 | x | x | x | ○ | ○ | ○ |

TABLE 3

| | Formation of Ag wiring on three-dimensional structure | | | | | | | | | | | |
|---|---|---|---|---|---|---|---|---|---|---|---|---|
| | Dropping method | | | | | | Dipping method | | | | | |
| | Ag wiring-forming property | | | Adhesion of Ag wiring | | | Ag wiring-forming property | | | Adhesion of Ag wiring | | |
| | Structure a | Structure b | Structure c | Structure a | Structure b | Structure c | Structure a | Structure b | Structure c | Structure a | Structure b | Structure c |
| Example 1 | ○ | ○ | ○ | ○ | ○ | ○ | ○ | ○ | ○ | ○ | ○ | ○ |
| Example 2 | ○ | ○ | ○ | ○ | ○ | ○ | ○ | ○ | ○ | ○ | ○ | ○ |
| Example 3 | ○ | ○ | ○ | ○ | ○ | ○ | ○ | ○ | ○ | ○ | ○ | ○ |
| Example 4 | ○ | ○ | ○ | ○ | ○ | ○ | ○ | ○ | ○ | ○ | ○ | ○ |
| Example 5 | ○ | ○ | ○ | ○ | ○ | ○ | ○ | ○ | ○ | ○ | ○ | ○ |
| Example 6 | ○ | ○ | ○ | ○ | ○ | ○ | ○ | ○ | ○ | ○ | ○ | ○ |
| Example 7 | ○ | ○ | ○ | ○ | ○ | ○ | ○ | ○ | ○ | ○ | ○ | ○ |
| Example 8 | ○ | ○ | ○ | ○ | ○ | ○ | ○ | ○ | ○ | ○ | ○ | ○ |
| Example 9 | ○ | ○ | ○ | ○ | ○ | ○ | ○ | ○ | ○ | ○ | ○ | ○ |

TABLE 3-continued

| | Formation of Ag wiring on three-dimensional structure | | | | | | | | | | | |
|---|---|---|---|---|---|---|---|---|---|---|---|---|
| | Dropping method | | | | | | Dipping method | | | | | |
| | Ag wiring-forming property | | | Adhesion of Ag wiring | | | Ag wiring-forming property | | | Adhesion of Ag wiring | | |
| | Structure a | Structure b | Structure c | Structure a | Structure b | Structure c | Structure a | Structure b | Structure c | Structure a | Structure b | Structure c |
| Comparative Example 1 | x | x | x | x | x | x | x | x | x | x | x | x |
| Comparative Example 2 | x | x | x | x | x | x | x | x | x | x | x | x |

When the resin compositions prepared in Examples 1 to 9 were used, structures having a lyophilic/liquid-repellent patterned film, in which the lyophilic portion was derived from the exposed part (recess) corresponding to the transparent portion of the film seal and the liquid-repellent portion was derived from the part other than the exposed part (protruded part), were obtained.

From the results shown in Table 2, it was found that, as compared to the coating films formed from the resin compositions prepared in Comparative Examples 1 and 2, the lyophilic/liquid-repellent patterned films which were formed from the resin compositions prepared in Examples 1 to 9 on the structures having a non-flat coating surface have superior lyophilic/liquid-repellent performance, outer appearance and adhesion along with a desired recessed pattern. That is, it was found that the resin compositions prepared in Examples 1 to 9 can be suitably used in the production of a three-dimensional structure having a recessed pattern.

The film thicknesses and contact angles of the recessed pattern parts and radiation-unirradiated parts of the coating films formed on the three-dimensional structures a to c are believed to be equivalent to those of the coating films formed on the above-described flat substrate.

When a metal wiring was formed by a dipping method, in Examples 1 to 9, after the three-dimensional structures were immersed in the silver nanoink and subsequently pulled out, the ink dripped down from the parts other than the recessed pattern, while in Comparative Examples 1 and 2, such dripping of the ink from the parts other than the recessed pattern did not occur even after the three-dimensional structures were pulled out. As a result, it was found that a favorable silver wiring can be formed on the structures having a non-flat surface by using the resin compositions prepared in Examples 1 to 9; and that, however, when the resin compositions prepared in Comparative Examples 1 and 2 are used, a favorable film cannot be formed due to the formation of a silver film covering each structure (Table 3).

That is, it was found that the resin compositions prepared in Examples 1 to 9 can be suitably used for the formation of an electroconductive film on a recessed pattern of a three-dimensional structure having the recessed pattern.

INDUSTRIAL APPLICABILITY

According to the present invention, a coating film having a recessed pattern can be easily formed on a three-dimensional structure having a non-flat surface. In addition, when a composition which comprises a polymer containing an acid-dissociable group having a fluorine atom is used, a lyophilic/liquid-repellent patterning can be formed from the coating film by irradiating the coating film with radiation. In the application of various inks such as electroconductive film-forming inks by a dropping method, a dipping method, a spray coating method or a printing method, this lyophilic/liquid-repellent patterned film is, because of its lyophilic and liquid-repellent performance, capable of assisting the patterning of the inks. Moreover, according to the present invention, a fine and elaborate pattern can be formed, and the resulting pattern shows excellent adhesion with three-dimensional structures having a non-flat surface. Therefore, structure having a recessed pattern formed in accordance with the present invention can be suitably used as a substrate in printed electronic devices.

The method of forming an electroconductive film according to the present invention enables to form a fine and elaborate electroconductive film (wiring) on a three-dimensional structure having a non-flat surface by a simple method such as a dropping method, a dipping method, a spray coating method or a printing method. In addition, since the resulting electroconductive film such as a metal wiring shows excellent electroconductivity and excellent adhesion with the three-dimensional structure, the method of forming an electroconductive film according to the present invention is suitably for the formation of an electronic circuit. Therefore, structure having a recessed pattern produced by the production method of the present invention can serve as substrates on which a semiconductor chip and the like are mounted and are effective for size reduction, thickness reduction, weight reduction and performance improvement in automobile components, liquid crystal displays, portable information devices such as cellular phones, digital cameras, organic displays, organic EL lights, electronic devices such as various sensors and wearable devices.

DESCRIPTION OF SYMBOLS

10: three-dimensional structure a
20: three-dimensional structure b
30: three-dimensional structure c
12: coating film-equipped three-dimensional structure a
14: recessed pattern or silver wiring
22: coating film-equipped three-dimensional structure b
24: recessed pattern or silver wiring
32: coating film-equipped three-dimensional structure c
34: recessed pattern or silver wiring

The invention claimed is:
1. A method of producing a structure having a recessed pattern, the method comprising (i) and (ii):
(i) forming a coating film on a non-flat surface of a structure using a resin composition which comprises an acid-dissociable group-containing polymer and an acid generator; and

(ii) forming a recess by subjecting a prescribed part of a portion of said coating film to irradiation with radiation, wherein:

the obtained recessed pattern has a film thickness that is thinner by 5% to less than 90% with respect to a thickness of the coating film obtained in (i); and the acid-dissociable group comprises a fluorine atom.

2. The method according to claim 1, further comprising (iii) heating the coating film after the irradiation with radiation.

3. The method according to claim 1, wherein the non-flat surface comprises at least one surface selected from the group consisting of a curved surface and an irregular surface.

4. A method of producing a structure having a recessed pattern, the method comprising (i) and (ii):
(i) forming a coating film on a non-flat surface of a structure using a resin composition which comprises an acid-dissociable group-containing polymer and an acid generator; and
(ii) forming a recess by subjecting a prescribed part of a portion of said coating film to irradiation with radiation, wherein:

the obtained recessed pattern has a film thickness that is thinner by 5% to less than 90% with respect to a thickness of the coating film obtained in (i); and a difference in contact angle with respect to tetradecane between the recessed pattern part and a radiation-unirradiated part is 30° or larger.

5. A method of producing a structure having a recessed pattern, the method comprising (i) and (ii):
(i) forming a coating film on a non-flat surface of a structure using a resin composition which comprises an acid-dissociable group-containing polymer and an acid generator; and
(ii) forming a recess by subjecting a prescribed part of a portion of said coating film to irradiation with radiation, wherein:

the obtained recessed pattern has a film thickness that is thinner by 5% to less than 90% with respect to a thickness of the coating film obtained in (i); and the acid-dissociable group is a group comprising at least one bond selected from the group consisting of an acetal bond and a hemiacetal ester bond.

6. The method according to claim 1, wherein the acid-dissociable group comprises at least one group having a formula selected from the group consisting of Formulae (1-1) and (1-2):

(1-1)
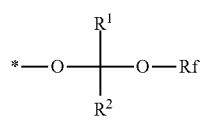

(1-2)
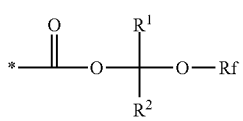

wherein $R^1$ and $R^2$ each independently represent a hydrogen atom or a methyl group; Rf independently represents a fluorine atom-containing organic group; and * represents a binding site.

7. The method according to claim 1, wherein the resin composition comprises a polymerizable compound having an ethylenically unsaturated bond.

8. The method according to claim 1, wherein the resin composition comprises at least one structural unit having a formula selected from the group consisting of Formulae (2) to (5):

(2)
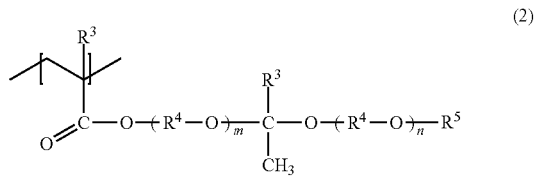

(3)
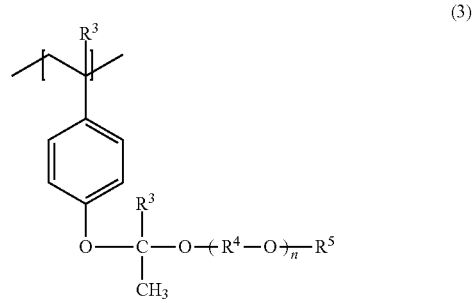

(4)
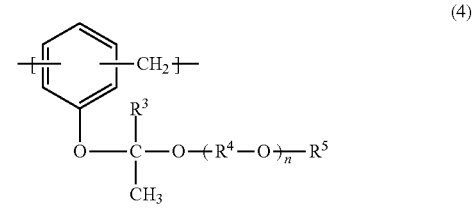

(5)
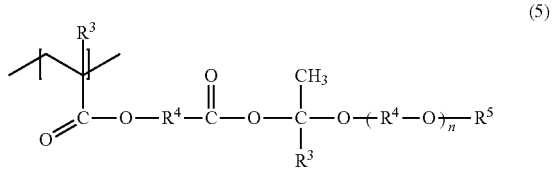

wherein $R^3$ independently represents a hydrogen atom or a methyl group; $R^4$ independently represents a methylene group, a C2-12 alkylene group, a C2-12 alkenylene group, a group in which the alkylene group or the alkenylene group is partially substituted with —O—, —(C=O)O— or —O(C=O)—, a C6-13 substituted or unsubstituted aromatic hydrocarbon group, a C4-12 substituted or unsubstituted alicyclic hydrocarbon group, or a group in which at least one hydrogen atom of the groups is substituted with a fluorine atom; $R^5$ independently represents a group in which at least one hydrogen atom of a hydrocarbon group is substituted with a fluorine atom; m represents 0 or 1; and n independently represents an integer of 0 to 12.

9. A method of forming an electroconductive film, the method comprising forming an electroconductive film using an electroconductive film-forming composition on a recessed pattern formed by the method according to claim 1.

10. A method of forming an electroconductive film, the method comprising forming an electroconductive film using an electroconductive film-forming composition on a recessed pattern formed by the method according to claim 4.

11. A method of forming an electroconductive film, the method comprising forming an electroconductive film using an electroconductive film-forming composition on a recessed pattern formed by the method according to claim 5.

* * * * *